(12) United States Patent
Steensgaard-Madsen

(10) Patent No.: US 8,232,905 B2
(45) Date of Patent: Jul. 31, 2012

(54) SEQUENTIALLY CONFIGURED ANALOG TO DIGITAL CONVERTER

(75) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 76 days.

(21) Appl. No.: 12/949,507

(22) Filed: Nov. 18, 2010

(65) Prior Publication Data

US 2011/0115661 A1    May 19, 2011

Related U.S. Application Data

(60) Provisional application No. 61/262,737, filed on Nov. 19, 2009.

(51) Int. Cl.
*H03M 1/12*    (2006.01)
(52) U.S. Cl. .......................................... 341/155; 341/161
(58) Field of Classification Search .................. 341/155, 341/163, 161
See application file for complete search history.

(56) References Cited

U.S. PATENT DOCUMENTS

| | | | |
|---|---|---|---|
| 7,015,841 B2* | 3/2006 | Yoshida et al. | 341/120 |
| 7,535,391 B1 | 5/2009 | Newman et al. | |
| 7,986,929 B2* | 7/2011 | Krone | 455/192.2 |
| 2003/0184459 A1 | 10/2003 | Engl | |
| 2005/0190092 A1 | 9/2005 | Gulati et al. | |
| 2008/0191922 A1 | 8/2008 | Sakurai | |
| 2008/0198057 A1 | 8/2008 | Kurauchi | |
| 2009/0085785 A1* | 4/2009 | Gerfers et al. | 341/143 |
| 2009/0224829 A1 | 9/2009 | Johansson | |
| 2010/0164761 A1* | 7/2010 | Wan et al. | 341/108 |

OTHER PUBLICATIONS

Notification of Transmittal of the International Search Report and the Written Opinion of the International Searching Authority issued in International Application No. PCT/US10/57378 dated Jan. 18, 2011.

* cited by examiner

*Primary Examiner* — Peguy Jean Pierre
(74) *Attorney, Agent, or Firm* — McDermott Will & Emery LLP

(57) ABSTRACT

An analog-to-digital converter (ADC) system and method. The ADC system includes a digital control circuit, an amplifier, a capacitor, and an evaluation circuit. The digital control circuit is configured to sequentially configure the ADC system in a first configuration and a second configuration to derive a digital representation of an analog signal value. The amplifier circuit includes an amplifier input terminal and an amplifier output terminal. The capacitor has a first capacitor terminal coupled to the amplifier input terminal in the first and second configurations of the ADC system. The capacitor further has a second capacitor terminal coupled to the amplifier output terminal in the first configuration of the ADC system. The evaluation circuit is configured to provide a first digital code to represent a first voltage level at the amplifier output terminal in the first configuration of the ADC system. The second capacitor terminal in the second configuration of the ADC system is coupled to a reference voltage potential selected according to the first digital code.

34 Claims, 18 Drawing Sheets

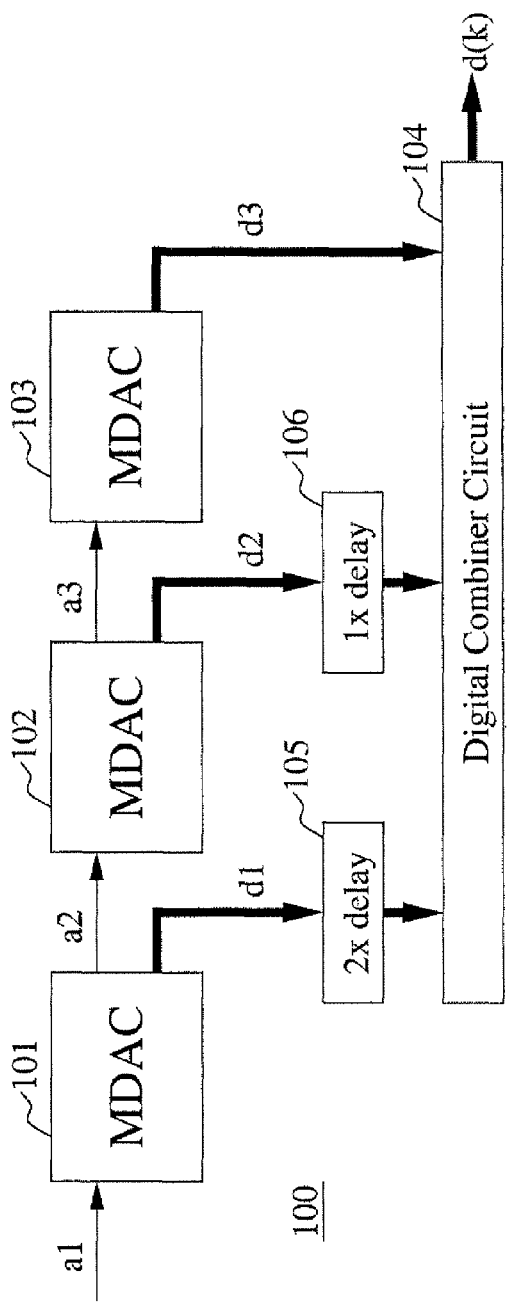
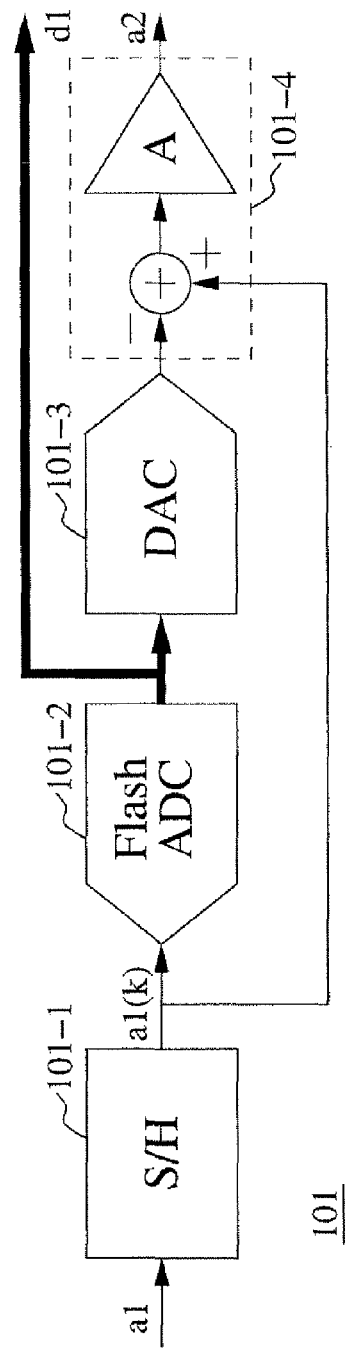
FIGURE 1(a) (PRIOR ART)
FIGURE 1(b) (PRIOR ART)

SEQUENTIALLY CONFIGURED ANALOG TO DIGITAL CONVERTER

RELATED APPLICATION

The present invention claims priority of provisional patent application No. 61/262,737, filed Nov. 19, 2009, the contents of which are incorporated herein in their entirety.

BACKGROUND

1. Technical Field

The present teaching relates to analog circuits. Particularly, the present teaching relates to analog-to-digital converters (ADCs).

2. Discussion of Technical Background

Analog-to-digital converters (ADCs) are used for a wide range of applications, including, but not limited to, sensor interfaces, industrial applications, consumer applications, and communications. Various circuits and techniques have been developed for analog-to-digital (A/D) conversion targeting various applications and their varying requirements in terms of speed, resolution, noise, power consumption, and other performance related parameters.

Successive approximation is a well-known sequential method used for A/D conversion, where an analog signal value may be sampled on a capacitive digital-to-analog converter structure (CDAC), and a sequential successive-approximation process is used to generate a digital representation of the analog signal value. Each step of a successive-approximation A/D conversion process may determine one bit of the digital representation, e.g., it may take 16 steps to generate a digital representation of 16-bit resolution. Accordingly, a maximum conversion rate limit for a successive-approximation ADC may be relatively low, e.g., one mega-samples-per-second (1 MSPS).

Sequential residue amplification is a well-known method for A/D conversion used in a pipelined ADC. FIG. 1(a) (Prior Art) shows a pipelined ADC 100 comprising three residue-amplifying circuit stages 101, 102, and 103, that are commonly known as MDAC stages. A first MDAC stage 101 receives and samples an analog input signal value $a1(k)$, and provides a first digital code d1 and an analog value a2 that is an amplified residue of $a1(k)$ with respect to d1 and a reference voltage VREF. FIG. 1(b) shows an exemplary implementation of MDAC 101 comprising a sample-and-hold (S/H) stage 101-1, a flash ADC 101-2, a digital-to-analog converter (DAC) 101-3, and an amplifier circuit 101-4. Sample-and-hold stage 101-1 samples analog input signal a1 and provides sampled analog input signal value $a1(k)$. Flash ADC 101-2 evaluates $a1(k)$ and provides digital code d1 representing $a1(k)$. For example, d1 may be a 2-bit representation of $a1(k)$. DAC 101-3 receives digital code d1 and provides a voltage d1*VREF. Amplifier circuit 101-4 receives $a1(k)$ and d1*VREF and provides an amplified residue voltage $a2 = A*(a1(k) - d1*VREF)$. Residue amplification factor A may, for example, be A=4. The output signals d1, a2 from MDAC 101 are delayed by one clock cycle with respect to the input signal a1. Such delays are not represented explicitly in FIGS. 2(a) and 2(b), which show (in part) nominal relationships of d1 and a2 with respect to a1 for a full-scale range of ADC 100 (from 0 Volts to VREF). MDAC stages 102 and 103 may be identical to the first MDAC stage 101. FIGS. 2(c)-2(f) show the input and output signals of these stages with respect to a1. A digital combiner circuit 104 combines the first, second, and third digital codes d1, d2, d3 generated by MDAC circuits 101, 102, and 103 to provide a digital representation d(k) of the sampled analog input signal value $a1(k)$. Note that d(k) is delayed by 3 clock cycles with respect to a1. A 2-clock-cycle delay circuit 105 is used to align d1 with d3, and a 1-clock-cycle delay circuit 106 is used to align d2 with d3. The residue amplification factors implemented by MDAC circuits 101, 102, and 103 are taken into account by the digital combiner circuit 104, and a numerical value of d(k)=d1+d2/4+d3/16 may represent a ratio $a1(k)$/VREF.

A pipelined ADC may comprise more or fewer MDAC stages than ADC 100. In addition, each individual MDAC stage may resolve a different number of bits. For example, a 4-stage pipelined ADC may resolve 6+4+2+2 bits using 4 MDAC stages to provide a 14-bit digital representation of an analog input signal value. Each stage of a pipelined ADC may perform one step of an overall A/D conversion process (of a particular analog signal value), but all stages may operate at the same time (each stage operating on distinct analog signal values). A pipelined ADC may be designed to operate at a higher conversion rate than that of a successive-approximation ADC, in part because each stage may perform only a small portion of the overall A/D conversion process, and in part because the pipelined conversion process may comprise fewer steps than the successive-approximation conversion process.

The process of passing an analog signal from one MDAC stage to another in a pipelined ADC (for example, a2 in ADC 100 of FIG. 1(a)) may cause accumulation of errors and noise. For example, amplifier circuit 101-4 in MDAC 101 of FIG. 1(b) may have a limited bandwidth, and may settle gradually towards a nominal value of a2. Incomplete settling may cause settling errors. To reduce such errors, an MDAC stage of a pipelined ADC may be required to achieve a relatively high degree of accuracy, which may impose a limit on a maximum achievable conversion rate and/or accuracy. Successive-approximation ADCs may be more favorable in this regard, because an analog signal value may be represented as an amount of charge on a circuit node that is substantially isolated throughout the conversion process. By not moving the analog signal from one circuit stage to another, successive-approximation ADCs may be less prone to such errors.

Successive-approximation ADCs may be clocked (by a conversion control signal initiating an A/D conversion process for each analog signal value) periodically, in bursts, or only once in a while. The general-purpose nature of successive-approximation ADCs allow such converters to be used for a wide range of applications. Pipelined ADCs may potentially achieve a higher maximum conversion rate by processing several analog signal values simultaneously, but that may be advantageous primarily for applications that require a substantially periodical A/D conversion process.

A residue-amplifying A/D conversion process implemented by pipelined ADC 100 in FIG. 1(a) may alternatively be implemented based on a non-pipelined ADC wherein a single MDAC stage is used repeatedly. Such ADCs may be known as cyclic or algorithmic ADCs. FIG. 3 shows an algorithmic ADC 107 where the first MDAC stage 101 of ADC 100 is used repeatedly to generate three digital codes d1, d2, d3 that are combined by digital combiner circuit 104 to generate a 6-bit digital representation d(k) of an analog input signal value $a1(k)$. In a first step of the conversion process, an analog multiplexer circuit 108 selects a1 to be processed by MDAC 101. MDAC 101 provides the first digital code d1 and an amplified residue signal r=a2 of $a1(k)$ with respect to d1 and VREF. In a second step of the conversion process, the multiplexer 108 selects r=a2 to be processed by MDAC 101 providing the second digital code d2 and an amplified residue value r=a3 of a2 with respect to d2 and VREF. In a third step of the conversion process, the multiplexer 108 selects the residue r=a3 to be processed by MDAC 101 providing the third digital code d3, which is combined with the first and second digital codes to provide d(k). Algorithmic ADC 107 is similar to a successive-approximation ADC in that it operates on only one analog signal value at a time. ADC 107 may be modified so that MDAC 101 resolves more bits per step of the conversion process, and a high-resolution digital representation may be obtained in as few as 3 or 4 sequential steps. Accordingly, an algorithmic ADC may be designed to have a higher maximum conversion rate limit than that of a successive-approximation ADC. However, when an MDAC stage is required to achieve a high degree of accuracy, it may impose a limit on a maximum conversion rate and overall accuracy that may be achieved.

What is needed is a general-purpose ADC circuit that can operate at a high conversion rate and maintain a high degree of accuracy.

SUMMARY

An embodiment of an analog-to-digital converter (ADC) system is described wherein an analog voltage is sampled and represented as an amount of charge that is substantially isolated on a node of a capacitive structure. The capacitive structure is coupled as a feedback network for an amplifier in a plurality of configurations during a plurality of steps of an A/D conversion process.

In a first step of the A/D conversion process, a first voltage at the amplifier output is converted to a first digital code (by an evaluation circuit, e.g., a flash ADC), and a first capacitor in the capacitive structure is disconnected from the amplifier output and applied a reference voltage potential selected according to the first digital code. Charge redistribution in the capacitive structure causes a second voltage to develop at the amplifier output.

In a second step of the A/D conversion process, similar to the first step, the second voltage at the amplifier output is converted to a second digital code, and a second capacitor in the capacitive structure is disconnected from the amplifier output and applied a reference voltage potential selected according to the second digital code. Charge redistribution in the capacitive structure causes a third voltage to develop at the amplifier output.

The A/D conversion process may comprise additional consecutive steps similar to the first and second steps, and the process provides a plurality of digital codes. The plurality of digital codes is combined to provide a digital representation of the analog voltage.

Another embodiment of an ADC system is described wherein redundancy is incorporated to provide a measure of robustness to incomplete settling of an amplifier.

Another embodiment of an ADC system is described wherein a charge-divider circuit is incorporated in a capacitive structure.

Another embodiment of an ADC system is described wherein an amplified residue voltage provided by a first ADC system according to this present teaching is sampled and A/D converted by a second ADC system according to this present teaching.

Another embodiment of an ADC system is described wherein an amplifier circuit stage is configured in an auto-zeroing configuration.

Another embodiment of an ADC system is described wherein an amplifier circuit is configurable and configured according to a feedback factor that varies from one step to another in an A/D conversion process.

BRIEF DESCRIPTION OF THE DRAWINGS

The present teachings claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 1(a) (Prior Art) illustrates a 3-step pipelined residue-amplifying ADC;

FIG. 1(b) (Prior Art) illustrates an MDAC circuit comprised in a residue-amplifying ADC of FIG. 1(a);

DETAILED DESCRIPTION

The present teaching discloses a residue-amplifying ADC circuit and method that can resolve several bits in each step of a conversion process, without causing accumulation of errors and noise by repeatedly sampling an analog signal value. The present teaching also discloses a residue-amplifying ADC circuit and method that does not need to achieve a high degree of accuracy in every step of a conversion process.

Figure 4:
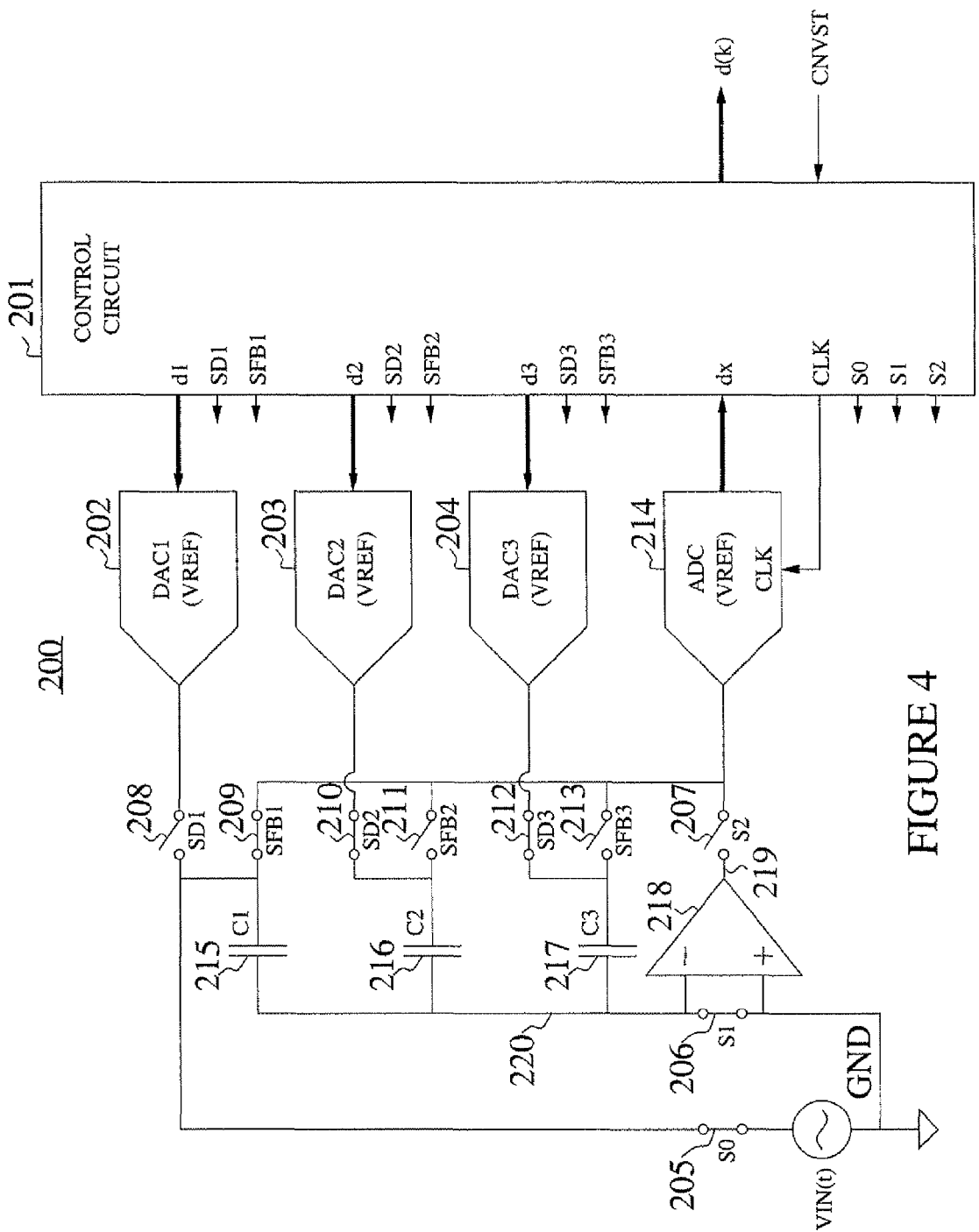
FIG. 4 illustrates a first embodiment of the present teaching.
Figure 5:
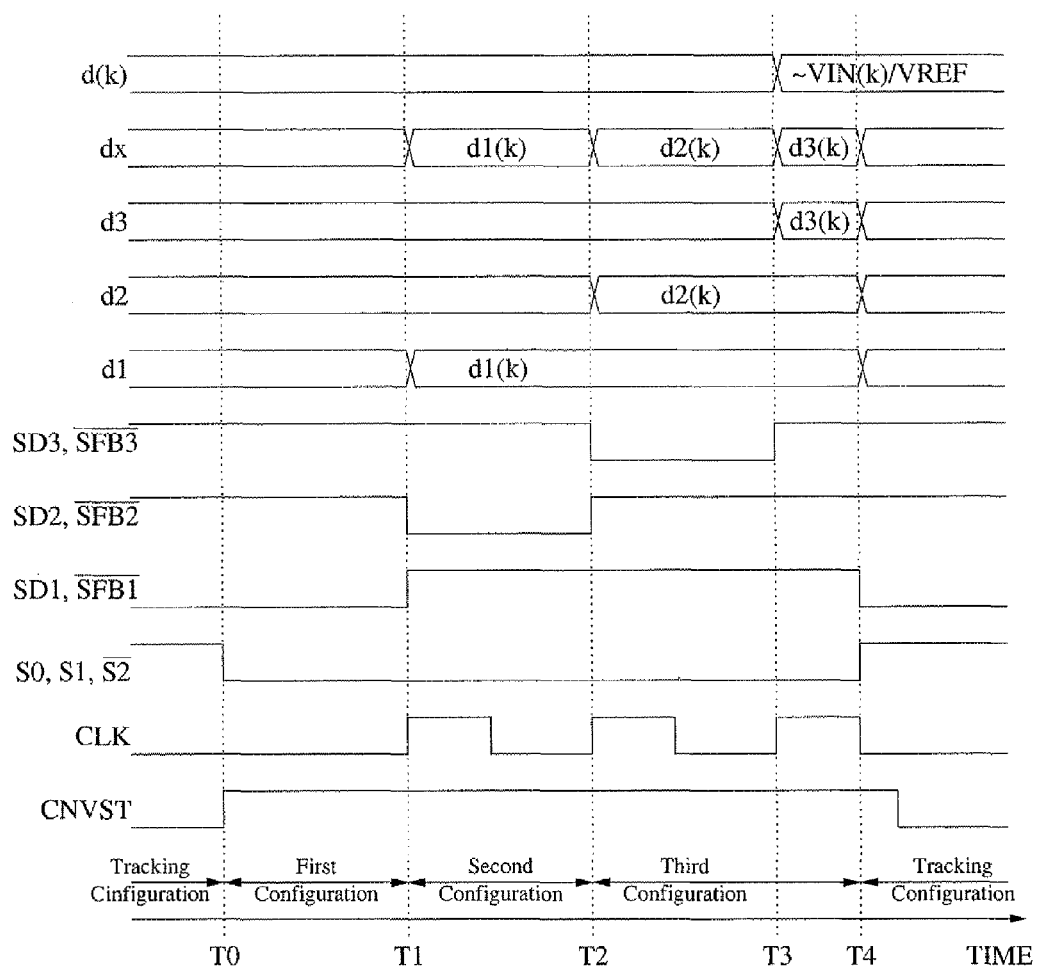
FIG. 5 illustrates a timing diagram for the first embodiment of the present teaching.

FIG. 4 shows a first embodiment of the present teaching. The first embodiment is a sequential residue-amplifying analog-to-digital converter (ADC) system 200 providing a digital representation d(k) of a sampled value VIN(k) of an analog input signal voltage VIN(t) at a sampling instant when a sampling control signal CNVST transitions from one state to another. A sequential A/D conversion process implemented by ADC system 200 is controlled by a digital control circuit 201 that sequentially configures ADC system 200 in a plurality of configurations. Digital control circuit 201 configures ADC system 200, in part, by providing a first digital code d1 to a first digital-to-analog converter (DAC1) 202, a second digital code d2 to a second DAC2 203, and a third digital code d3 to a third DAC3 204. The digital control circuit 201 further configures ADC system 200 by providing a plurality of control signals (S0, S1, S2, SD1, SFB1, SD2, SFB2, SD3, SFB3, and CLK) to control a plurality of switches 205, 206, 207, 208, 209, 210, 211, 212, 213 and a flash (one-step) ADC 214. An exemplary timing diagram in connection with the operation of control circuit 201 is shown in FIG. 5.

In a tracking configuration of ADC system 200, switches 205 and 206 are closed (substantially conductive) to couple the input voltage signal VIN(t) to charge a first capacitor C1 215 according to VIN(t). In the tracking configuration, switches 207, 208, 211, and 213 are open (substantially non-conductive) and switches 205, 206, 209, 210, and 212 are closed. The digital control circuit 201 applies digital codes d2, d3 in such a manner that DACs 203 and 204 charge a second and a third capacitor C2 216 and C3 217 to predefined voltages. DACs 202, 203, and 204 operate with respect to a reference voltage range, and they output reference voltage potentials selected according to digital codes d1, d2, d3. In accordance with the present teaching, digital codes d1, d2, d3 in the ADC system 200 are assigned numerical values and DACs 202, 203, and 204 provide output voltages (defined with respect to a reference voltage potential at a node labeled GND) that nominally equal to a numerical value of each digital code multiplied by a reference voltage quantity VREF. A reference voltage generator circuit providing a plurality of reference voltage potentials (e.g., GND and VREF) is not shown explicitly in FIG. 4, and a suitable implementation of such a circuit (e.g., a bandgap reference voltage circuit) is well known by those skilled in the art. In the tracking configuration of ADC system 200, the digital control circuit 201 may, for example, apply digital codes d2, d3 representing a numerical value of 1/4, whereby capacitors 216 and 217 are nominally charged by DACs 203 and 204 to VREF/4 via closed switches 206, 210, and 212. Switch 207 is open in the tracking configuration of the ADC system 200, and an amplifier circuit 218 may be in an auto-zeroing configuration.

When conversion control signal CNVST transitions (with a positive polarity) to initiate an A/D conversion process, the digital control circuit 201 reconfigures ADC system 200 from the tracking configuration to a first configuration by toggling switches 205, 206, and 207. Accordingly, in the first configuration of ADC system 200, switches 205, 206, 208, 211, and 213 are open and switches 207, 209, 210, and 212 are closed. Capacitor 215 couples an output terminal 219 of amplifier 218 to an input terminal 220 of amplifier 218 to establish a negative-feedback configuration of amplifier 218. When switch 206 is open, an amount of charge representing a sampled value VIN(k) of the analog input signal VIN(t) is substantially isolated on a node of a capacitive structure coupled to terminal 220. Accordingly, an amount of charge that is in proportion to VIN(k) may be isolated on a node of the capacitive structure. Switch 206 may not be closed again until the end of the conversion process. In the first configuration, a first voltage at amplifier output terminal 219 may be substantially the sampled value VIN(k), which is evaluated by flash ADC 214. Flash ADC 214 is clocked by the digital control circuit 201 at a first time T1 (marked on a time axis in FIG. 5) when ADC system 200 is configured in the first configuration. In response to the clock signal provided by the digital control circuit 201, flash ADC 214 provides a first digital code dx to represent the first voltage. The digital control circuit 201 applies the first digital code dx=d1 during subsequent steps of the conversion process. Flash ADC 214 may operate with respect to the same reference voltage range as DACs 202, 203, and 204 operate, and a gain function from the input of flash ADC 214 to the output of DAC1 202 may be substantially unity when d1 equals dx.

After the first digital code d1 has been determined in the first step of the conversion process, by clocking flash ADC 214 in the first configuration of ADC system 200, the digital control circuit 201 reconfigures ADC system 200 to a second configuration by toggling switches 208, 209, 210, and 211. Accordingly, in the second configuration of ADC system 200, switches 205, 206, 209, 210, and 213 are open and switches 207, 208, 211, and 212 are closed. A reference voltage potential d1*VREF provided by DAC1 202 may differ from VIN(k), and cause a charge redistribution in capacitors C1 215 and C2 216. Capacitor C2 216 couples amplifier output terminal 219 to amplifier input terminal 220, and a second voltage (a first amplified residue voltage) develops at output terminal 219 when amplifier 218 has settled. After a period of time, sufficient to allow amplifier 218 to settle to a certain degree of accuracy, flash ADC 214 is clocked again by the digital control circuit 201 at a second time T2 (marked on the time axis in FIG. 5) when ADC system 200 is configured in the second configuration. In response to being clocked, flash ADC 214 provides a second digital code dx to represent the second voltage. The digital control circuit 201 applies the second digital code dx=d2 during subsequent steps of the conversion process.

After the second digital code d2 has been determined in the second step of the conversion process, by clocking flash ADC 214 in the second configuration of ADC system 200, the digital control circuit 201 reconfigures ADC system 200 to a third configuration by toggling switches 210, 211, 212, and 213. Accordingly, in the third configuration of ADC system 200, switches 205, 206, 209, 211, and 212 are open and switches 207, 208, 210, and 213 are closed. A reference voltage potential d2*VREF provided by DAC2 203 may differ from the second voltage and cause a charge redistribution in capacitors C2 216 and C3 217. Capacitor C3 217 couples amplifier output terminal 219 to amplifier input terminal 220, and a third voltage (a second amplified residue voltage) develops at output terminal 219 when amplifier 218 has settled. After a period of time, sufficient to allow amplifier 218 to settle to a certain degree of accuracy, flash ADC 214 is clocked again by the digital control circuit 201 at a third time T3 (marked on the time axis in FIG. 5) when ADC system 200 is configured in the third configuration. In response to being clocked, flash ADC 214 provides a third digital code dx to represent the third voltage. The digital control circuit 201 combines the third digital code dx=d3 with the first and second digital codes d1, d2 to provide the digital representation d(k) of VIN(k).

Figure 2:
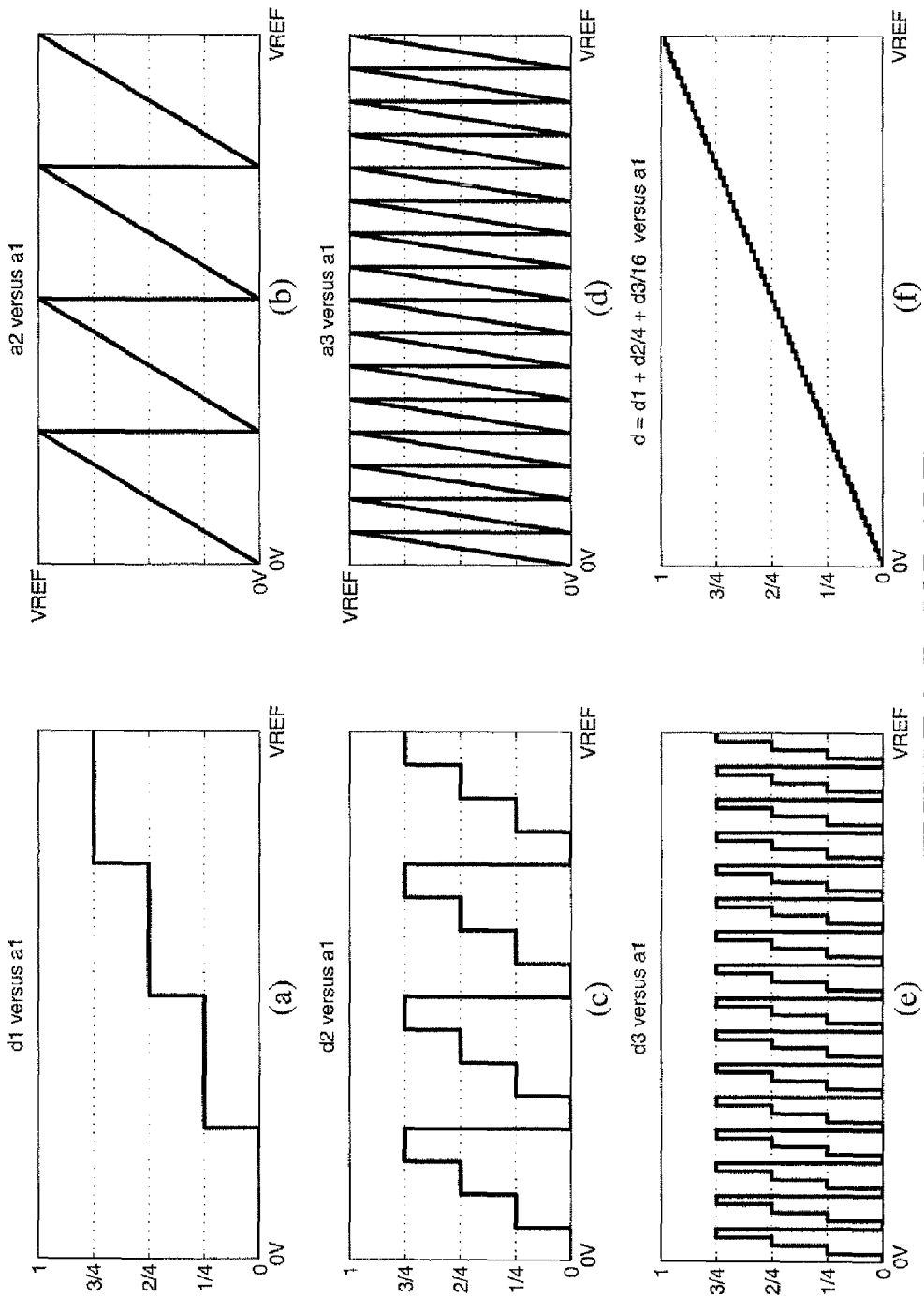
FIGS. 2(a)-2(f) (Prior Art) illustrate exemplary relationships of different signals from different stages of a 3-step pipelined residue-amplifying ADC of FIG. 1(a)
Figure 3:
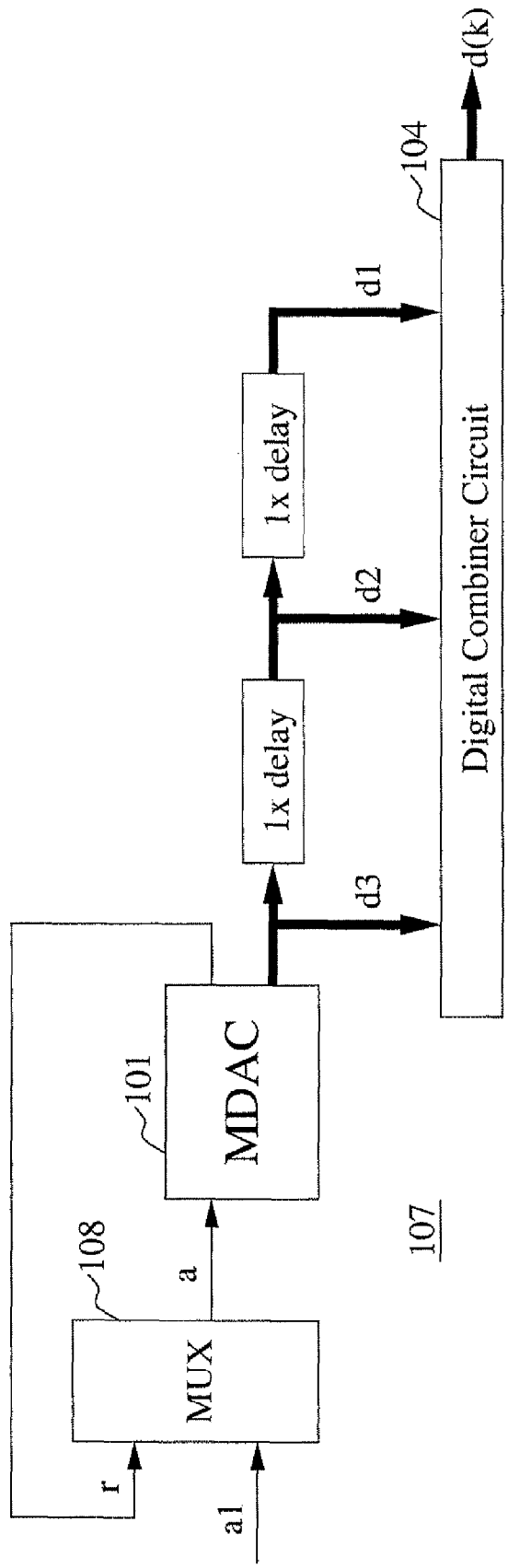
FIG. 3 (Prior Art) illustrates a 3-step algorithmic ADC.

The residue-amplifying ADC system 200 of FIG. 4 may be designed to implement the same nominal operation as that of prior-art algorithmic ADC 107 of FIG. 3. For example, a first residue amplification factor A1 may be set to A1=4 by selecting a ratio of capacitors C1 215 and C2 216. A second residue amplification factor A2 may be set to A2=4 by selecting a ratio of capacitors C2 216 and C3 217. Likewise, transition points and other characteristics of flash ADC 214, and values for digital codes d2, d3 in the tracking configuration, may be selected to obtain nominal characteristics similar to those of ADC 107.

An exemplary implementation of the residue-amplifying ADC system 200 of FIG. 4, the first embodiment of this present teaching, incorporates redundancy to achieve a measure of robustness to incomplete settling of amplifier 218 and to imperfections of flash ADC 214. For example, flash ADC 214 may incorporate a plurality of comparator circuits and a voltage divider circuit to set nominal transition points, and component mismatches may cause actual transition points to deviate from nominal transition points. Those skilled in the art will appreciate the benefits of incorporating redundancy in a prior-art residue-amplifying ADC (prior-art ADCs 100 and 107 of FIGS. 1(a) and 3 may be modified to incorporate redundancy), e.g. to provide a measure of robustness to imperfections of a flash ADC. However, redundancy may not substantially reduce the need for an MDAC stage to achieve a high degree of accuracy. An important aspect of the present teaching is that adding redundancy can make the conversion process of ADC system 200 more tolerant to incomplete settling (and other types of imperfections, including flash ADC imperfections). Accordingly, ADC system 200 may be operated at a relatively higher maximum conversion rate when it preferably is designed to incorporate redundancy.

Figure 6:
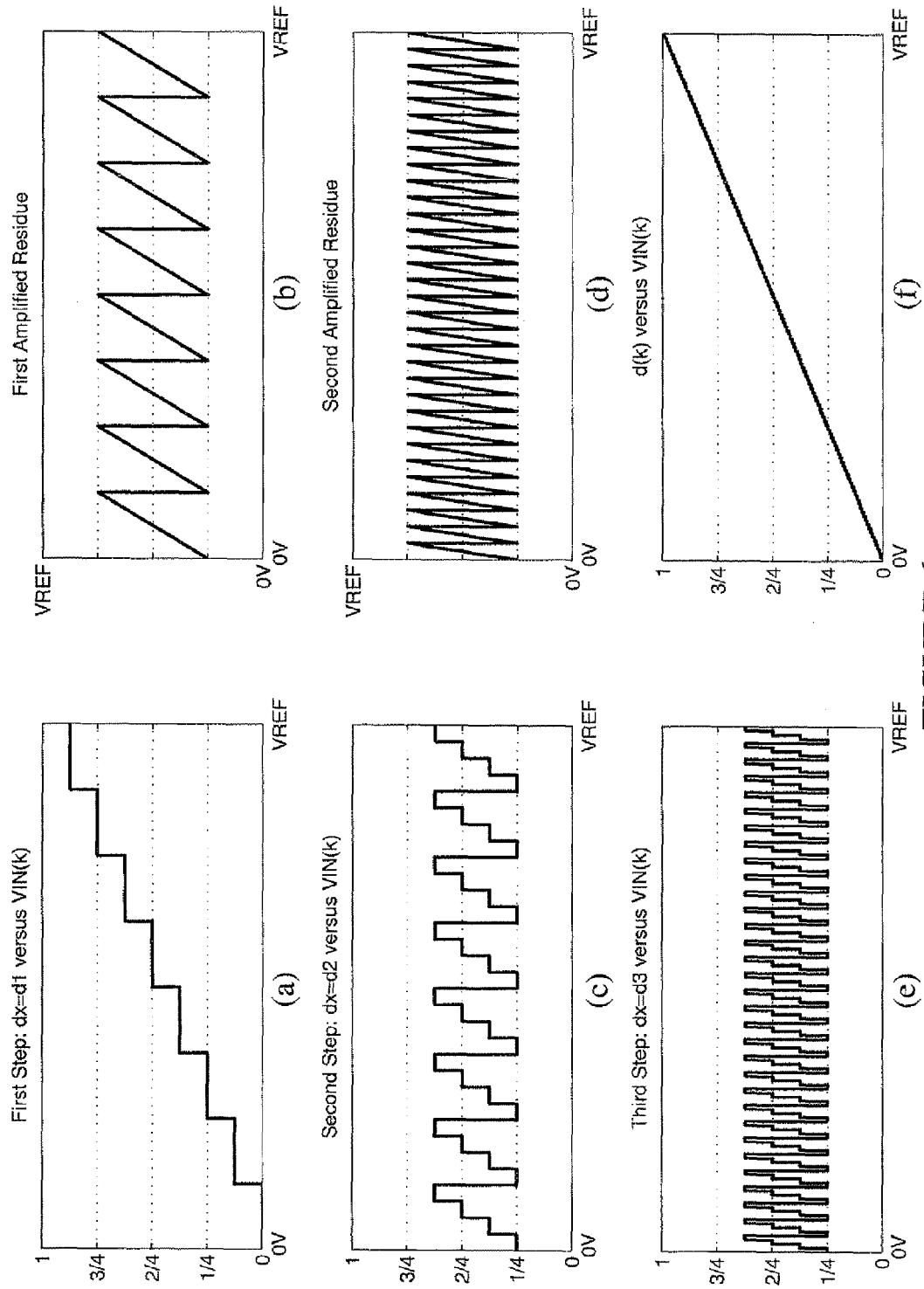
FIGS. 6(a)-6(f) illustrate exemplary relationships for the first embodiment of the present teaching.

Redundancy may be incorporated in ADC system 200 by increasing a resolution of flash ADC 214 and DACs 202, 203, and 204 relative to residue amplification factors. For example, in the first preferred embodiment, flash ADC 214 and DACs 202, 203, and 204 may be selected to have 3-bit resolution, and a first and a second residue amplification factor may be set to four (A1=A2=4) by scaling accordingly C1 215, C2 216, and C3 217. FIG. 6 shows an exemplary relationship of dx=d1 versus VIN(k) for flash ADC 214 when clocked in the first configuration of ADC system 200. A first amplified residue voltage may be shifted (along the vertical axis) by selecting a value of d2 applied during the tracking configuration. Accordingly, several parameters may be selected to maximize a benefit of incorporating redundancy. FIG. 6 also shows exemplary relationships of dx=d2 and dx=d3 provided in second and third steps of the conversion process, as well as a second amplified residue and an exemplary combination of d1, d2, d3 to provide d(k).

Figure 7:
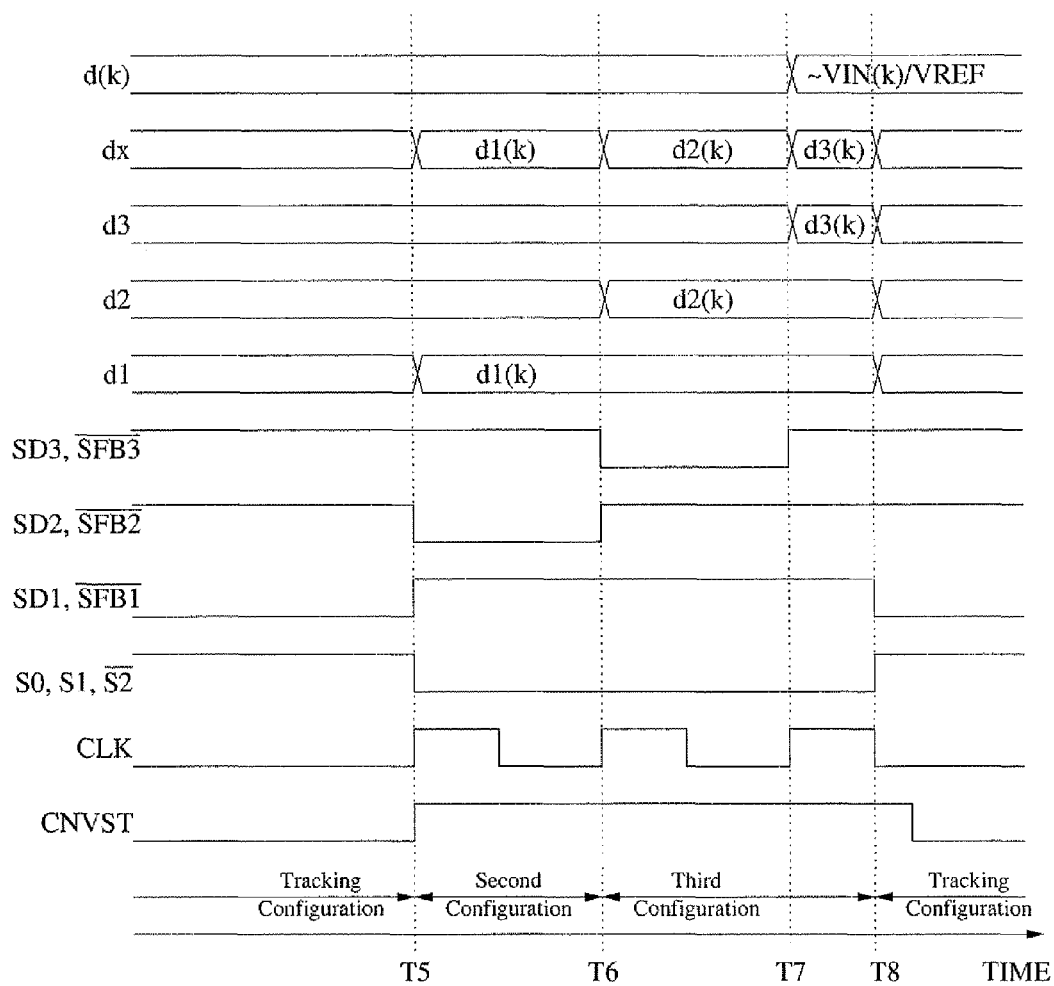
FIG. 7 illustrates a timing diagram for a second embodiment of the present teaching.

A second embodiment may be derived from the first embodiment by substantially reducing a duration of the first step of the conversion process. In the second embodiment, a modified digital control circuit 201 clocks flash ADC 214 with very little delay after the conversion control signal CNVST transitions. The nominal operation of ADC system 200 may be substantially maintained, because the input voltage of flash ADC 214 when CNVST transitions may be nominally the same as it may be in the first embodiment at time T1 (FIG. 5). Accordingly, the first configuration of ADC system 200 in the first embodiment of the present teaching may be a holding phase for the sampled value VIN(k) of VIN(t). A holding phase may not be needed when ADC system 200 incorporates redundancy, and the second embodiment of this present teaching may operate without an explicit holding phase. FIG. 7 shows an exemplary timing diagram for the second embodiment, similar to the exemplary timing diagram of FIG. 5 for the first embodiment. Other embodiments may incorporate a short holding phase that is shorter in duration than the second and third configurations. A maximum conversion rate limit may be increased when a duration of the conversion process is decreased.

Figure 8:
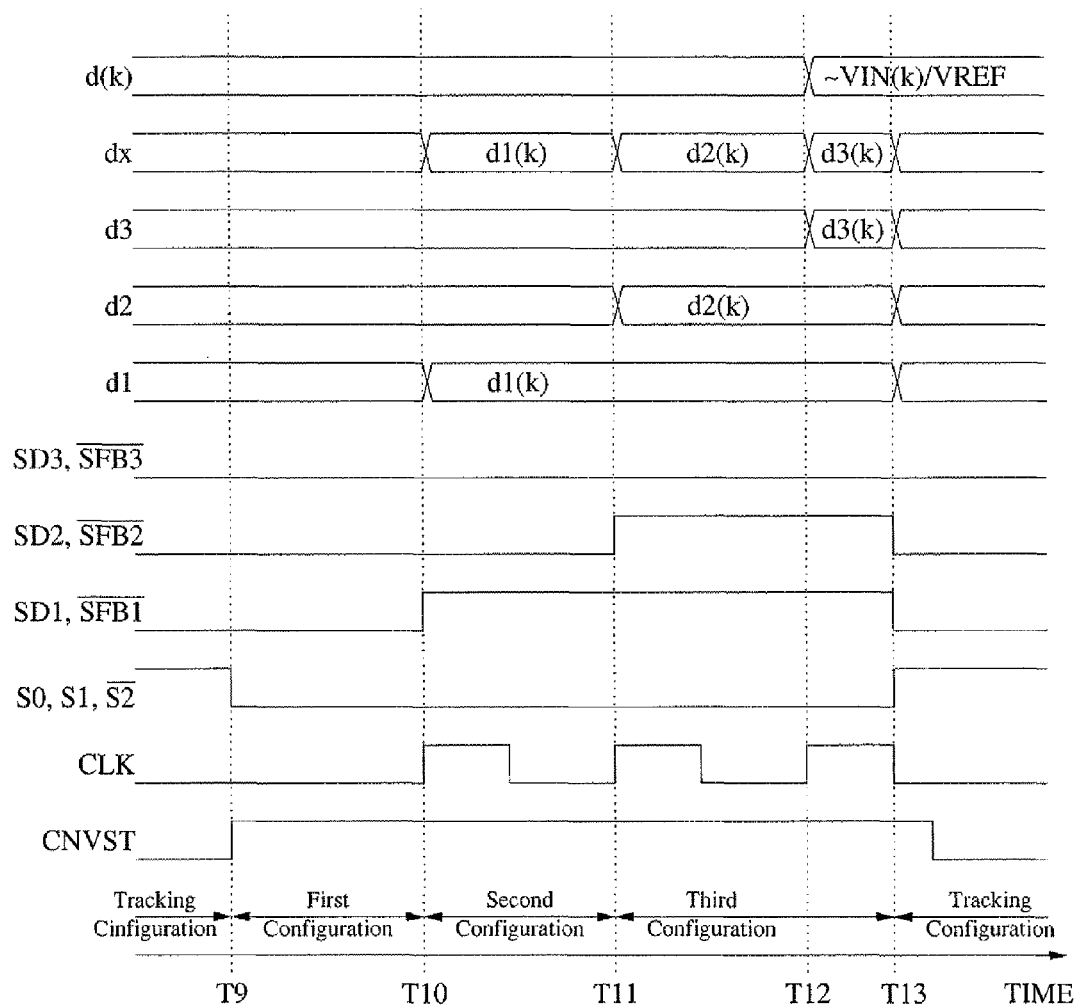
FIG. 8 illustrates a timing diagram for a third embodiment of the present teaching.

A third embodiment of the present teaching incorporates another modified operation of a digital control circuit 201. FIG. 8 shows an exemplary timing diagram for the third embodiment. In a tracking configuration, an input voltage signal VIN(t) is configured to charge capacitors C1 215, C2 216, and C3 217. A sampled value VIN(k) of VIN(t) is (optionally) held and applied as a first input voltage to flash ADC 214 in a first configuration of ADC system 200, wherein capacitors C1 215, C2 216, and C3 217 are included in a capacitive structure having a first node coupled to amplifier input terminal 220 and several terminals coupled to amplifier output terminal 219. Flash ADC 214 is clocked at a first time T10, and a resulting first digital code d1 is applied to DAC1 202. The digital control circuit 201 then reconfigures ADC system 200 to a second configuration by toggling switches 208 and 209. Accordingly, a reference voltage potential d1*VREF (provided by DAC1 202) is selected according to d1 and coupled to a terminal of capacitor C1 215 via switch 208. The selected reference voltage potential may differ from VIN(k) and cause a charge redistribution in capacitors C1 215, C2 216, and C3 217. A second voltage (first amplified residue voltage) develops at amplifier output terminal 219 as amplifier 218 settles in the second configuration. Several parameters may be selected to maximize a benefit of incorporating redundancy. For example, a combined transfer characteristic of flash ADC 214 and DAC1 202 may be selected to center the first amplified residue voltage in a full-scale range. The digital control circuit 201 clocks flash ADC 214 again at a time T11, and a resulting second digital code d2 is applied to DAC2 203. The digital control circuit 201 then reconfigures ADC system 200 to a third configuration by toggling switches 210, 211. A third voltage (second amplified residue voltage) develops at the amplifier output terminal 219 as amplifier 218 settles in the third configuration. A combined transfer characteristic of flash ADC 214 and DAC2 203 may be selected to center the second amplified residue in a full-scale range. The digital control circuit 201 clocks flash ADC 214 again at a time T12, and a resulting third digital code d3 is combined with the first and second digital codes d1, d2 to provide a digital representation d(k) of VIN(k). Switch 213 is always closed and switch 212 is always open in this third embodiment (allowing capacitor C3 217, switches 212, 213, and DAC3 204 to be substituted by a single fixed-value capacitor).

For a total capacitance C=C1+C2+C3, the third preferred embodiment may, for example, be implemented using C1/C=3/4, C2/C=3/16, and C3/C=1/16. The digital words d1, d2, d3 may be combined using the relationship $$d(k)=(3/4)*(d1+d2/4+d3/16).$$

Flash ADC 214 may provide digital codes corresponding to a set of numerical values {0, 1/8, 2/8, 3/8, 4/8, 5/8, 6/8, 7/8, 8/8} and transitions may occur according to a set of normalized transition points {11/64, 17/64, 23/64, 29/64, 35/64, 41/64, 47/64, 53/64}.

Figure 9:
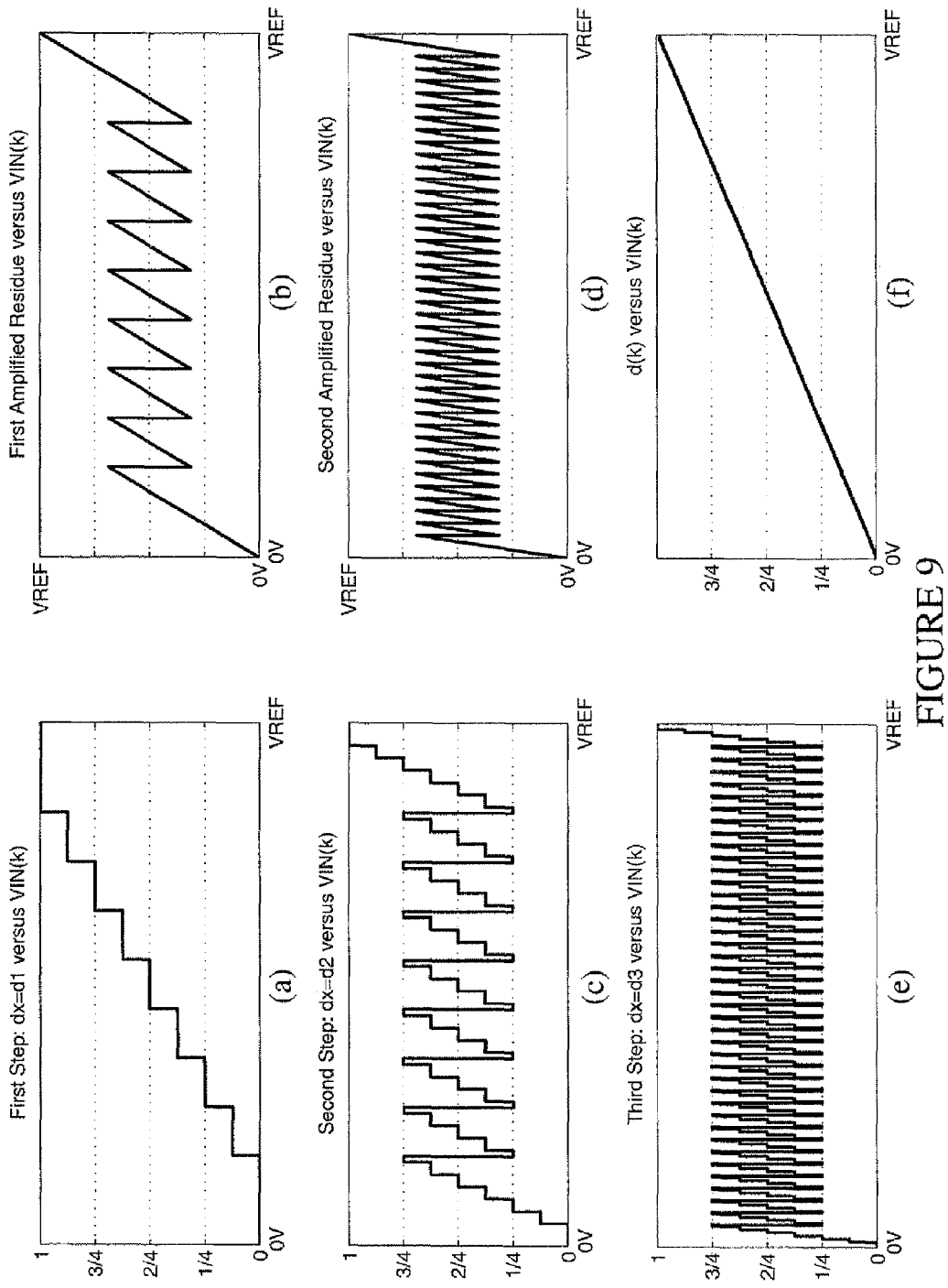
FIGS. 9(a)-9(f) illustrate exemplary relationships for the third embodiment of the present teaching.

FIG. 9 shows exemplary relationships of signals for an implementation of the third embodiment. The first configuration of ADC system 200 in the third embodiment may not be required, and another embodiment incorporates a modification of the third embodiment similar to the described modification of the first embodiment to derive the second embodiment.

Figure 10:
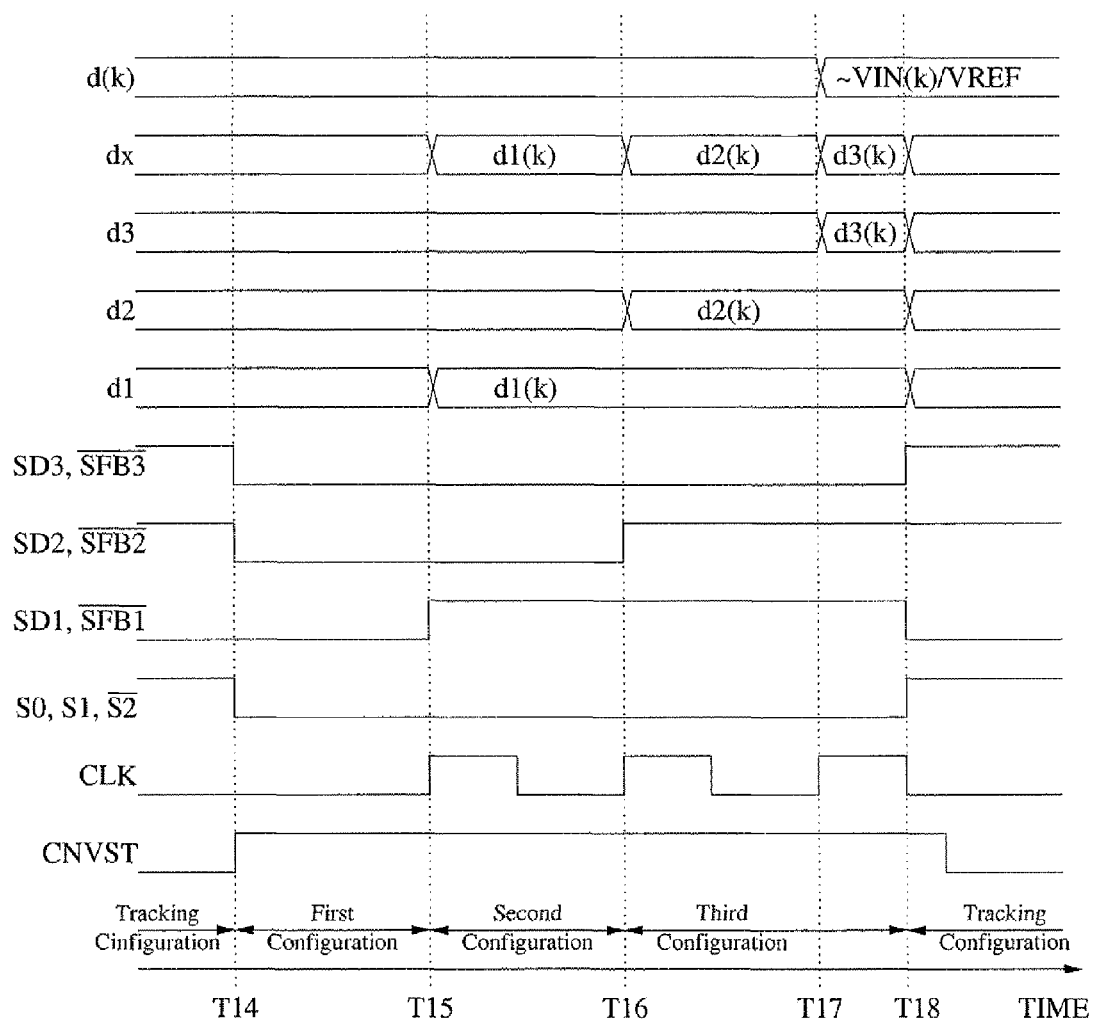
FIG. 10 illustrates a timing diagram for a fourth embodiment of the present teaching.
Figure 11:
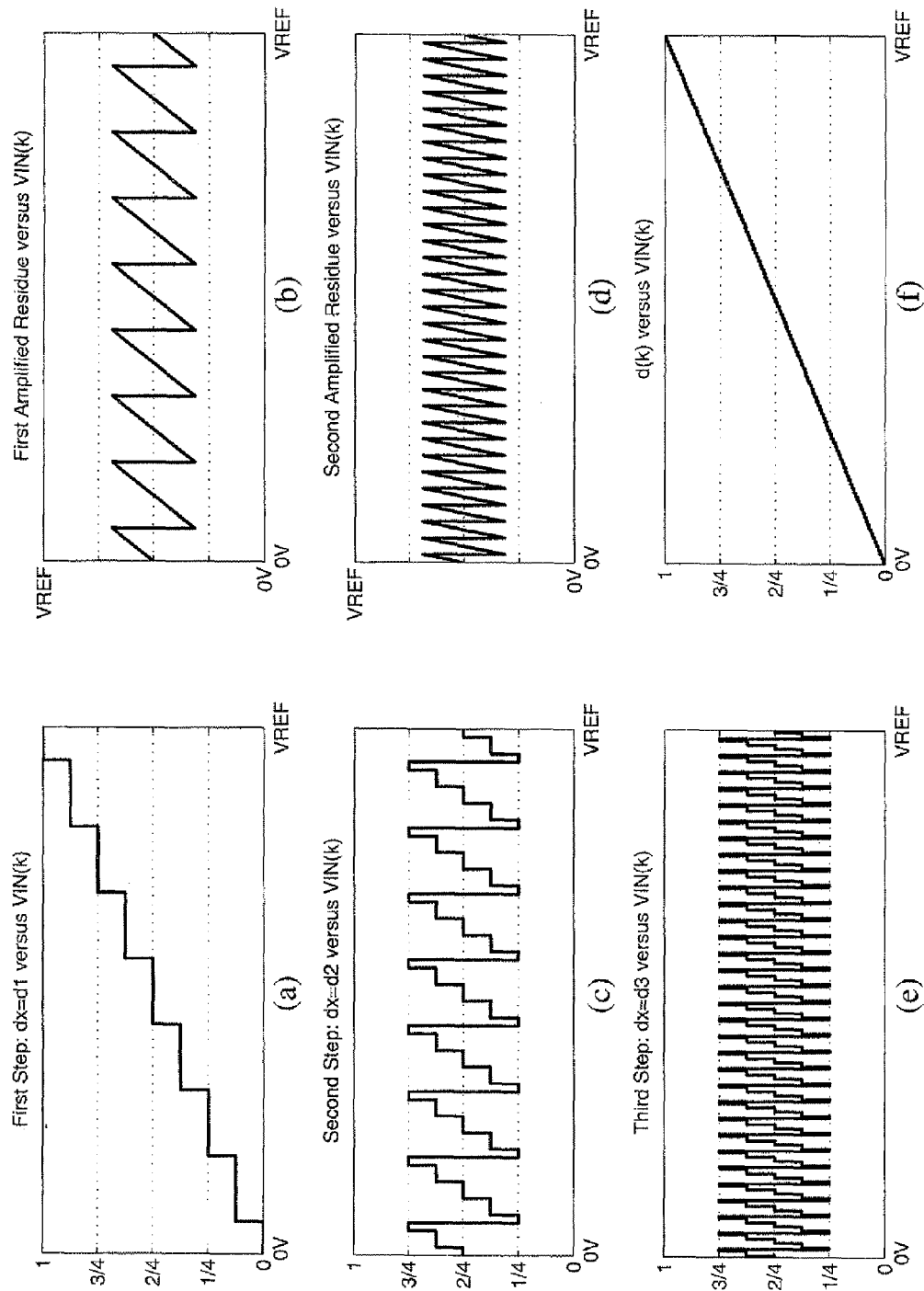
FIGS. 11(a)-11(f) illustrate exemplary relationships for the fourth embodiment of the present teaching.

A benefit of incorporating redundancy may be further improved by modifying the third embodiment such that an input signal VIN(t) is tracked and sampled on only a portion of a capacitive structure to attenuate a signal level. A fourth embodiment of the present teaching incorporates another modified operation of a digital control circuit 201. FIG. 10 shows an exemplary timing diagram for the fourth embodiment. In a tracking configuration, an input voltage signal VIN(t) is coupled to charge capacitor C1 215 in proportion to VIN(t), and capacitors C2 216 and C3 217 are applied predefined reference voltage potentials via DACs 203 and 204. Except for the tracking configuration, the fourth embodiment may be identical to the third embodiment. A combination of digital codes d1, d2, d3 may be chosen such that a selected full-scale range of d(k) is obtained. FIG. 11 shows relationships for an exemplary choice of parameters for the fourth embodiment.

The four embodiments described so far represent several possible variations of ADC 200 shown in FIG. 4. Many other variations of the present teaching are feasible as different embodiments, which are all within the scope of the present teaching. A digital representation d(k) of VIN(k) may preferably have a relatively high resolution, and embodiments of the present teaching may be adapted to derive digital representations of various resolutions. A resolution of d(k) may be increased in several ways. In one embodiment, for example, flash ADC 214 and DACs 202, 203, and 204 may operate with G-bit digital codes d1, d2, d3, which may be combined to a digital representation d(k) of 16-bit resolution when redundancy is incorporated. A first and a second residue amplification factor may be selected to be 32, and a corresponding ratio of C1 215 and C3 217 may be relatively large when the ADC system 200 is implemented as shown in FIG. 4. It may be preferred that a capacitive structure be designed and scaled such that a ratio of a largest and a smallest capacitor is not excessively large. Capacitive DAC (CDAC) structures used in prior-art successive-approximation ADCs provide several examples of charge-divider circuits and scaling techniques that may be adopted and incorporated in several embodiments of this present teaching.

Figure 12:
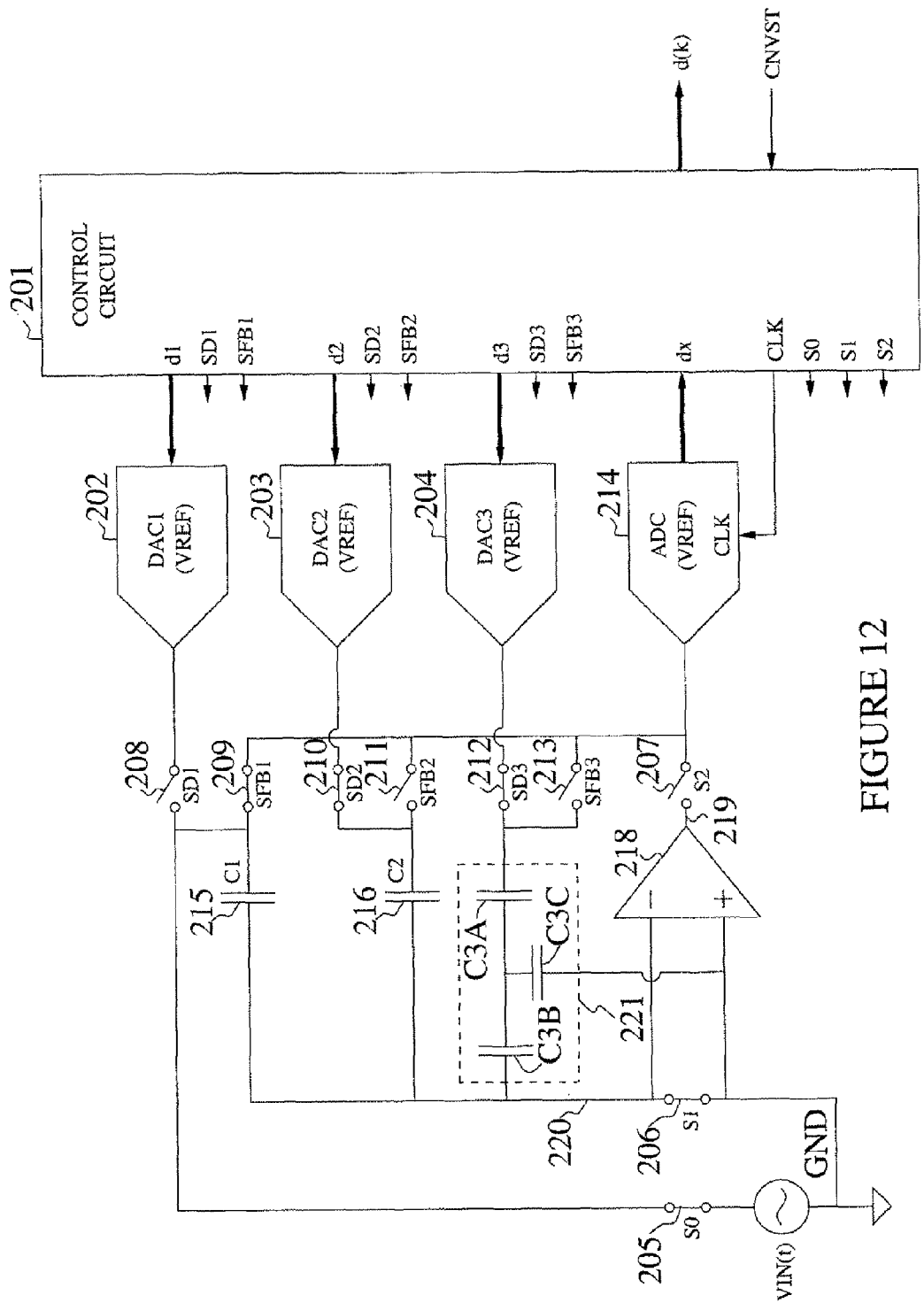
FIG. 12 illustrates a fifth embodiment of the present teaching.

FIG. 12 shows a fifth embodiment wherein a charge-divider circuit 221 is incorporated to reduce a ratio of a largest and a smallest capacitor. Flash ADC 214 and DACs 202, 203, and 204 may operate with digital codes of 6-bit resolution, and a first and a second residue amplification factor may be selected to be A1=A2=32. Capacitor C3 217 in FIG. 4 is substituted in FIG. 12 by charge-divider circuit 221 comprising 3 capacitors: C3A, C3B, C3C. A first terminal of charge-divider circuit 221 is connected to terminal 220, a second terminal is connected to switches 212 and 213, and a third terminal is connected to GND. Charge-divider circuit 221 may be scaled such an amount of charge flowing in the first terminal (when node 220 is effectively held at a substantially fixed potential by amplifier 218) is a small fraction of an amount of charge flowing in the second terminal. A charge-division ratio may be chosen by scaling capacitors C3B and C3C. A ratio of a voltage variation across first and second terminals and an amount of charge flowing to terminal 220 via capacitor C3B may correspond to a capacitance that is substantially smaller than a capacitance of C3A, C3B, C3C. Accordingly, charge-divider circuit 221 may be used to reduce a ratio of a largest and a smallest capacitor. Those who are skilled in the art will recognize that charge-divider circuit 221 is merely an example of a broad range of scaling circuits and techniques that may be used to realize a voltage-to-charge ratio equivalent to a small capacitor using one or more larger capacitors. All such circuits are herein classified as charge-divider circuits.

A high-resolution representation d(k) may alternatively be provided by including additional DACs 202, 203, 204, . . . , capacitors 215, 216, 217, . . . and configurations in ADC system 200 of FIG. 4. In one embodiment, for example, a 16-bit digital representation may be derived in an 8-step A/D conversion process with redundancy, using a 3-bit flash ADC, 8 DACs, 8 capacitors, and 8 configurations of the extended ADC system. Charge-divider circuits may be used to implement one or more of the capacitors to reduce a ratio of a largest and a smallest capacitor.

Figure 13:
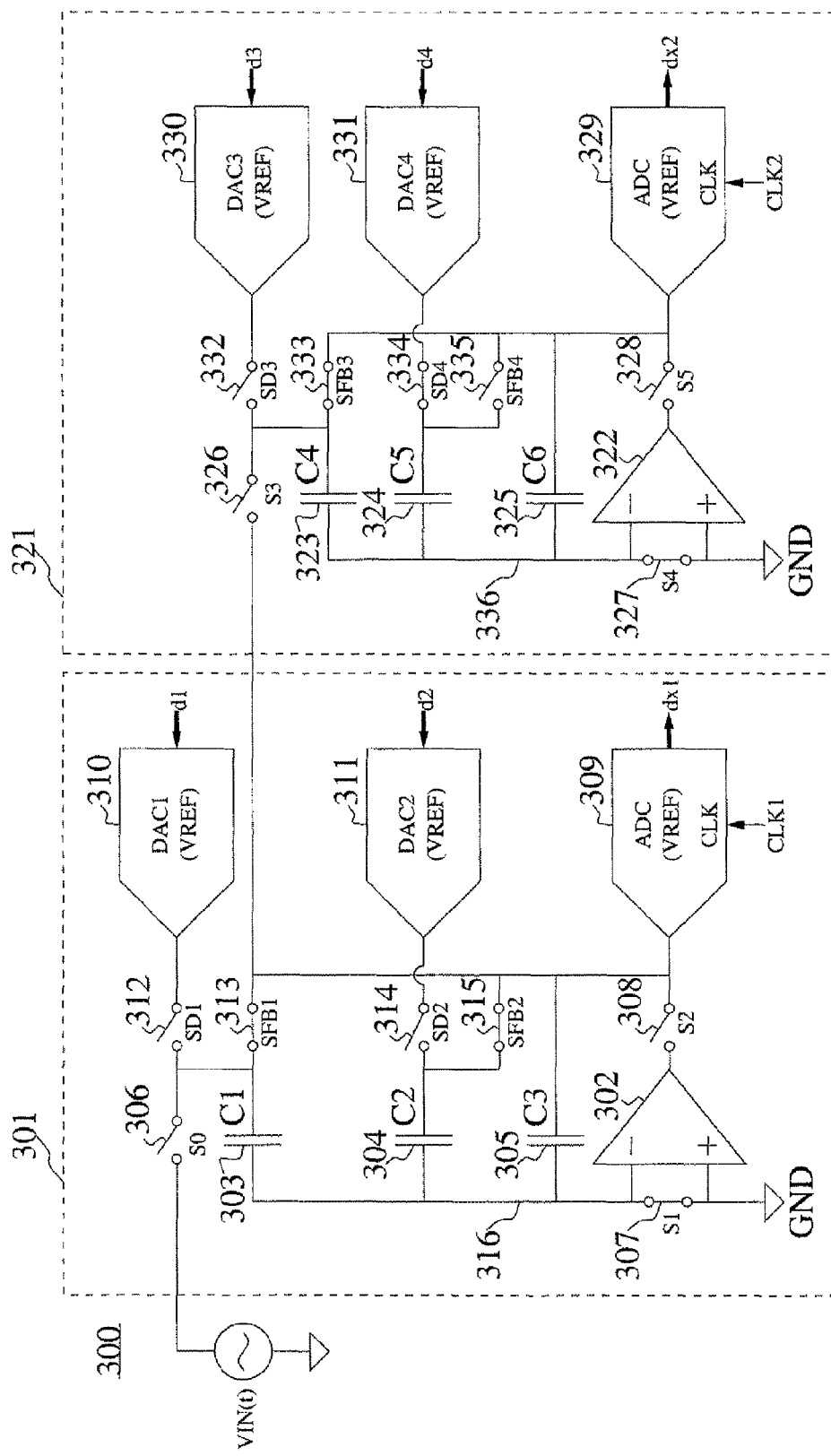
FIG. 13 illustrates a sixth embodiment of the present teaching.
Figure 14:
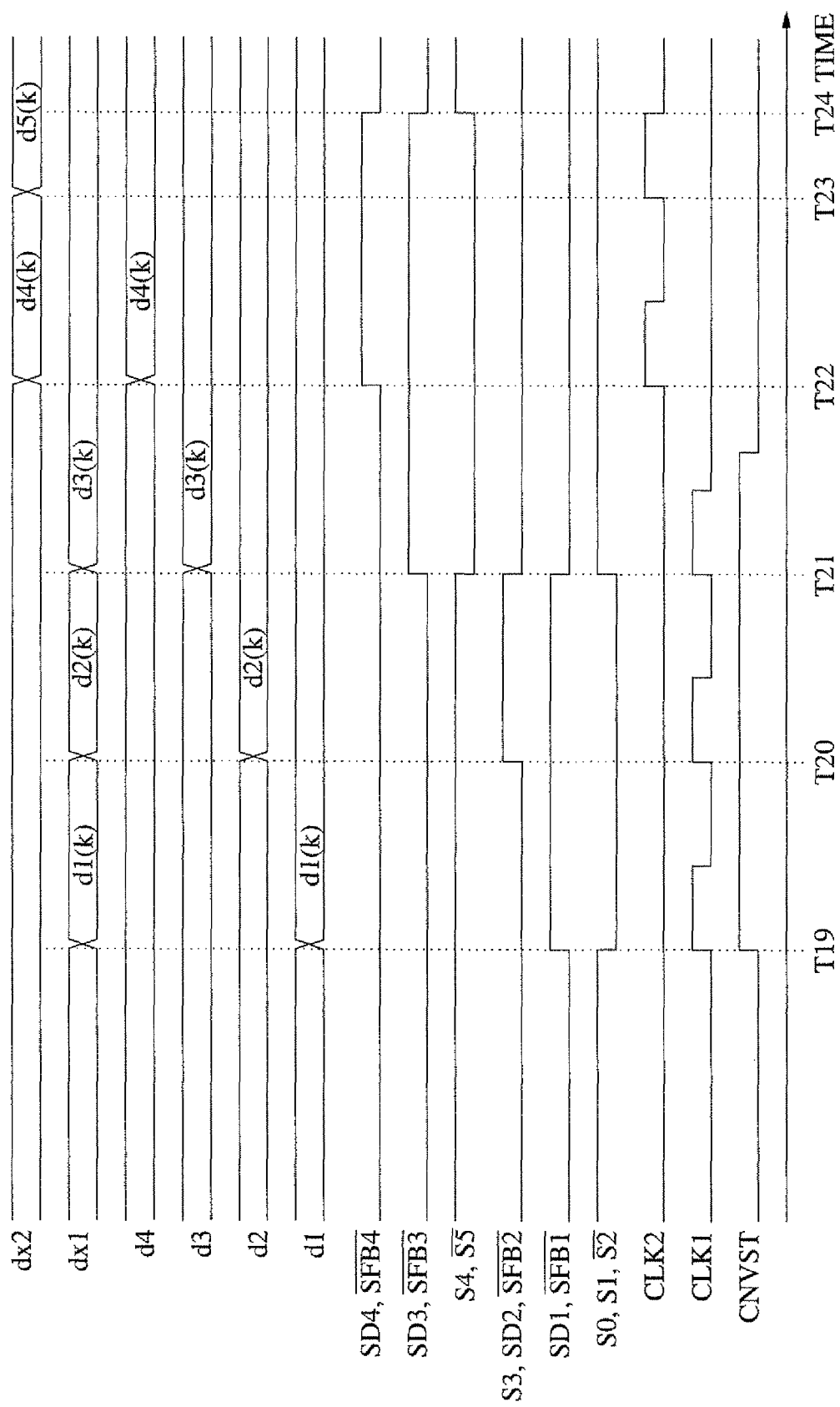
FIG. 14 illustrates a timing diagram for the sixth embodiment of the present teaching.

According to the present teaching, the residue-multiplying ADC circuit and method may be incorporated into a pipelined ADC structure. To relax settling requirements it may be preferable to transfer a highly amplified residue from a first stage to a second stage. FIG. 13 shows a sixth embodiment. The sixth embodiment is a five-step ADC system 300 based on a first residue-amplifying ADC 301 and a second residue-amplifying ADC 321, according to the present teaching. The two ADCs 301 and 321 may have a similar circuit structure and may be scaled versions of one another (e.g., to optimize a power parameter). An input signal VIN(t) is coupled to charge capacitors C1 303, C2 304, and C3 305 in a tracking configuration of ADC 301 when switches S0 306 and S1 307 are closed and switch S2 308 is open. Flash ADC 309 is clocked by a digital control circuit (not shown explicitly in FIG. 13, but an operation is represented by an exemplary timing diagram shown in FIG. 14) at a time T19 and a first digital code dx1=d1 representing VIN(k) with a predefined relationship is transferred to DAC1 310. Switches S0, S1, S2, SD1, SFB1 (306, 307, 308, 311, and 312, respectively) are toggled at time T19, and a charge redistribution in capacitors C1 303, C2 304, and C3 305 results in a first amplified residue voltage that is evaluated by clocking flash ADC 309 at a time T20. A second digital code dx1=d2 representing the first amplified residue is applied to DAC2 311. Switches SD2 314 and SFB2 315 are toggled at time T20, as is a switch S3 326 in the second residue-amplifying ADC 321. A charge redistribution in capacitors C2 304 and C3 305 results in a second amplified residue voltage that is evaluated by clocking flash ADC 309 at a time T21, providing a third digital code dx1=d3. The second amplified residue voltage is coupled to charge capacitors C4 323, C5 324, and C6 325 in a tracking configuration of ADC 321 applied between time T20 and T21. The second amplified residue voltage is sampled by ADC 321 when switches S3 326 and S4 327 are toggled at time T21, at which point the first residue-amplifying ADC 301 is configured back to its tracking configuration to acquire a next value of the input signal VIN(t). The third digital code d3, representing the second amplified residue voltage, is applied to DAC3 330, and a charge redistribution in capacitors C4 323, C5 324, and C6 325 results in a third amplified residue voltage, which is evaluated by flash ADC 329 at a time T22 to provide a fourth digital code dx2=d4. The fourth digital code d4, representing the third amplified residue voltage, is applied to DAC4 331, and a charge redistribution in capacitors C5 324 and C6 325 results in a fourth amplified residue voltage, which is evaluated by flash ADC 329 at a time T23 to provide a fifth digital code dx2=d5. Digital codes d1, d2, d3, d4, d5 are combined to provide a digital representation d(k) of VIN(k), and all switches in ADC 321 are returned to a default position at a time T24. A subsequent A/D conversion process may be initiated before an ongoing A/D conversion process has completed.

The sixth embodiment ADC 300 may be modified in several ways. For example, amplifier 302 may not be required for an operation when amplifier 322 is required for an operation, and vice versa. Accordingly, amplifiers 302 and 322 may be substituted by a single amplifier circuit that may be used alternately (multiplexed) in ADC 301 and ADC 321. A similar observation may apply to flash ADCs 309 and 329, which may also be substituted by a flash ADC that is used alternately in ADCs 301 and 321. Residue-amplifying ADCs 301 and 321 may be modified to incorporate more or fewer steps (and in many other ways) to achieve preferred speed and resolution specifications.

In several embodiments of the present teaching, a configurable capacitive structure is used as a feedback network to couple an amplifier circuit in a plurality of negative-feedback configurations. The feedback network may correspond to a first feedback factor in a first configuration and a second feedback factor in a second configuration. The first and second feedback factors may be substantially different. For example, an absolute value of the first feedback factor may be close to one, and an absolute value of a weaker second feedback factor may be close to zero.

Figure 15:
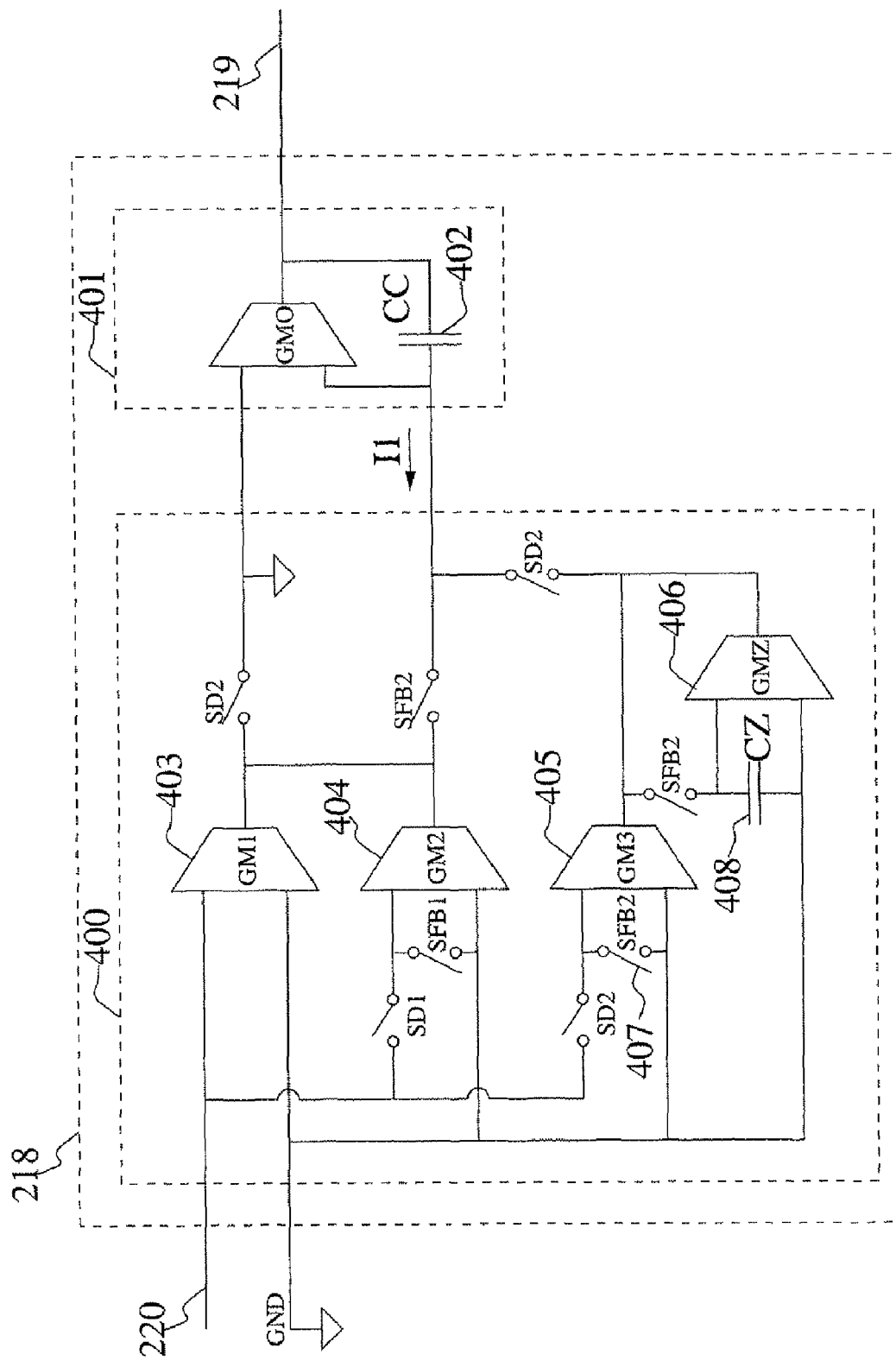
FIG. 15 illustrates a configurable auto-zeroing amplifier circuit.

In some embodiments of the present teaching, to optimize a settling behavior for individual configurations of an ADC system, it may be preferable to incorporate an amplifier circuit that is configurable with respect to a frequency response. FIG. 15 shows a preferred implementation of a configurable amplifier 218 for use in ADC system 200 of FIG. 4. An operation of digital control circuit 201 may correspond to FIG. 10. Amplifier 218 of FIG. 15 is a two-stage amplifier circuit, comprising a first amplifier stage 400 and an amplifier output stage 401. Two-stage amplifiers are familiar to those skilled in the art, and it will be recognized that a gain-bandwidth product is proportional to an effective transconductance GM of the first amplifier stage 400 and inversely proportional to a capacitance of a compensation capacitor CC 402. A settling speed (inversely proportional to a time constant) is a function of the gain-bandwidth product and a feedback factor characterizing a feedback network coupling amplifier output terminal 219 to amplifier input terminal 220. Amplifier input terminal 220 may be an inverting input terminal, such that applying a positive voltage to amplifier input terminal 220 (with respect to GND) will cause the amplifier output stage 401 to draw a current via amplifier output terminal 219 to reduce a voltage at terminal 219. The effective transconductance GM of amplifier input stage 400 is configurable via switches controlled by control signals SD1, SFB1, SD2, SFB2 provided by digital control circuit 201 of FIG. 4.

In a first configuration of ADC system 200, capacitors C1 215, C2 216, and C3 217 may couple amplifier output terminal 219 to amplifier input terminal 220 with little or no attenuation, and amplifier 218 may be designed to be configurable for a unity-gain configuration. In the first configuration, switches within amplifier 218 that are controlled by control signals SD1, SD2 are open and those controlled by SFB1, SFB2 are closed. Accordingly, in the first configuration, a first transconductance stage 403 provides an output current I1 to the amplifier output stage 401, and the effective transconductance GM=GM1 of the first amplifier stage 400 is substantially that of the first transconductance stage 403.

In a second configuration of ADC system 200, capacitors C2, C3 may couple output terminal 219 to input terminal 220, and capacitor C1 215 may be coupled to DAC1 202 and cause a substantial reduction of a feedback factor. To optimize a settling speed in the second configuration, amplifier 218 may be configured to have an increased gain-bandwidth product in the second configuration of ADC system 200. In the second configuration, switches within amplifier 218 that are controlled by control signals SFB1, SD2 are open and those controlled by SD1, SFB2 are closed. Accordingly, a second transconductance stage 404 contributes to (provides a portion of) the output current I1 resulting in an increased effective transconductance GM and gain-bandwidth product of amplifier 218. The effective transconductance GM=GM1+GM2 is provided by the first transconductance stage 403 operating in parallel with a second transconductance stage 404.

In a third configuration of ADC system 200, capacitor C3 may couple amplifier output terminal 219 to amplifier input terminal 220, and capacitors C1 215 and C2 216 may be coupled to DACs 202 and 203 and cause a reduction of a feedback factor. To optimize a settling speed in the third configuration, amplifier 218 may be configured to have a further increased gain-bandwidth product in the third configuration of ADC system 200. In the third configuration, switches within amplifier 218 that are controlled by control signals SFB1, SFB2 are open and those controlled by SD1, SD2 are closed. The first and second transconductance stages 403 and 404 are not contributing to the effective transconductance GM, which is provided substantially by a third transconductance stage 405.

An auto-zeroing configuration of the third transconductance stage 405 may be applied during the first and second configurations. In the auto-zeroing configuration, an auto-zeroing switch 407 may apply a zero input to the third transconductance stage 405, and an offset-compensating transconductance stage 406 may be configured as a resistive load to establish an offset voltage across an offset-holding capacitor CZ 408. In the third configuration of ADC system 200, the offset-compensating transconductance stage 406 may provide an offset-compensating current that is combined with an offset current from the third transconductance stage 405, such than an effective offset evaluated at amplifier input terminal 220 is substantially zero. A transconductance GMZ of the offset-compensating transconductance stage 406 may be smaller than GM3.

ADC system 200 may incorporate redundancy to provide a measure of robustness to potential offset imperfections of the first and second transconductance stages 403 and 404. Accordingly, a performance metric for ADC system 200 may be improved by offset-compensating the third transconductance stage 405 without necessarily offset-compensating the first and second transconductance stages 403 and 404.

The exemplary configurable amplifier circuit 218 of FIG. 15 may be modified in several ways. For example, compensation capacitor CC 402 may be made configurable instead of, or in addition to, the effective transconductance GM of first amplifier stage 400. Amplifier 218 of FIG. 15 is a two-stage amplifier, but an amplifier circuit may comprise more or fewer stages than the exemplary amplifier circuit. Gain-enhancing circuit techniques, such as cascode and regulated-cascode configurations, may be used to obtain a large gain factor using a relatively small number of circuit stages. A noise-bandwidth is also related to the gain-bandwidth product, and configurable amplifier 218 may be configured to optimize a noise performance metric instead of (or in combination with) a settling speed.

Figure 16:
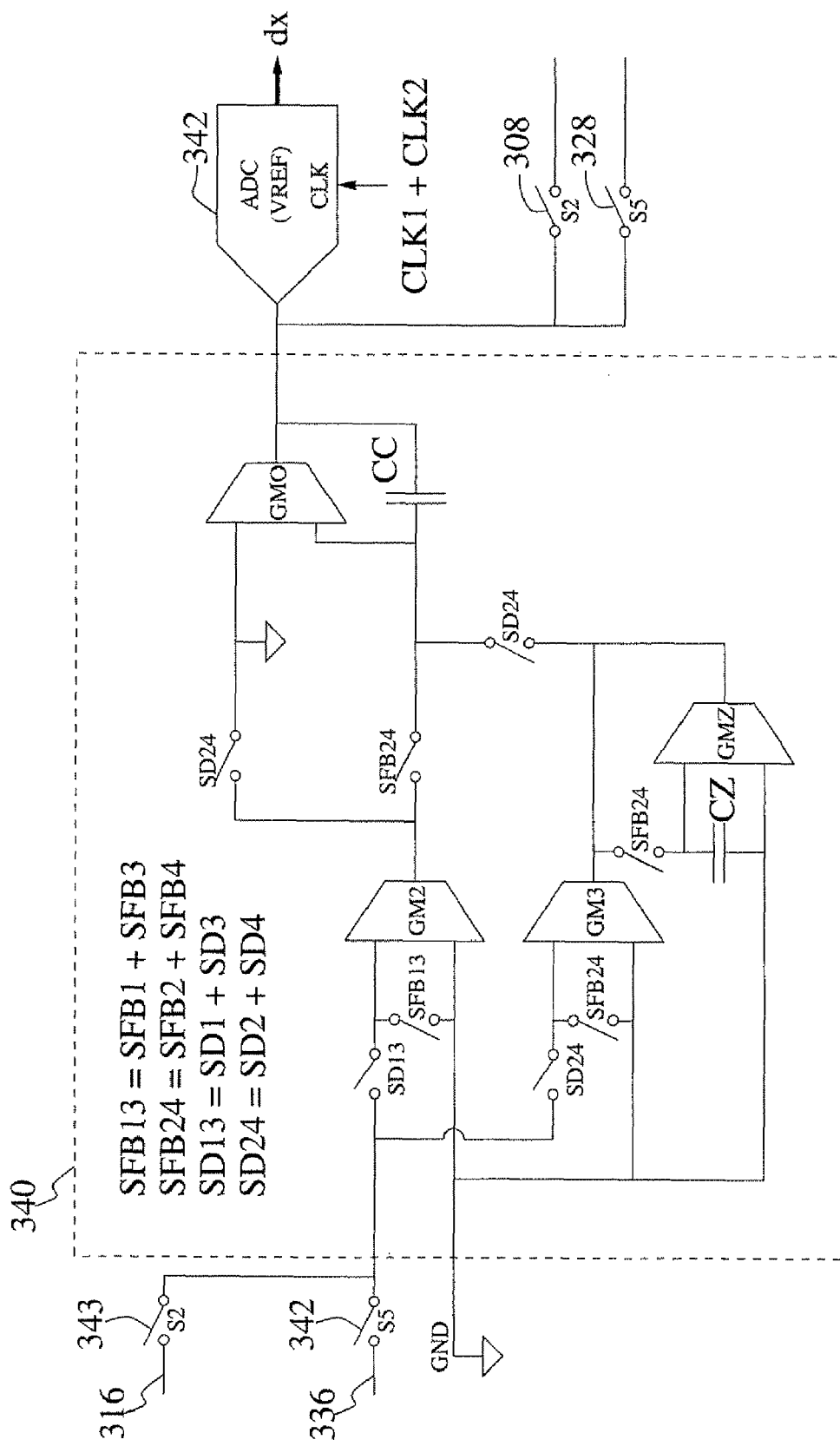
FIG. 16 illustrates a multiplexed configurable auto-zeroing amplifier circuit.

FIG. 16 shows another configurable amplifier circuit 340 that may be used in a multiplexed operation in the fifth preferred embodiment (ADC system 300 of FIG. 13). Amplifier circuit 340 of FIG. 16 may be a substitute for amplifier circuits 302 and 322 in FIG. 13. A flash ADC 342 in FIG. 16 may be a substitute for flash ADCs 309 and 329 in FIG. 13. Switches 342 and 343 in FIG. 16, in conjunction with switches 308 and 328 (shown in both FIGS. 13 and 16), switch/multiplex amplifier circuit 340 so that it performs an operation of amplifier circuit 302 when control signal S2 closes switches 308 and 343, and so that it performs an operation of amplifier circuit 322 when control signal S5 closes switches 328 and 342. Flash ADC 342 is an evaluation circuit configured to evaluate a voltage at an output terminal of amplifier 340 and it may be clocked when either flash ADC 309 and 329 (FIG. 13) is clocked. Accordingly, flash ADC 342 may provide a sequence of digital codes d1, d2, d3, d4, d5 when clocked consecutively at times marked T19, T20, T21, T22, T23 in FIG. 14. Residue-amplifying ADCs 301 and 321 of FIG. 13 do not incorporate a holding phase (another embodiment does incorporate a holding phase) and amplifiers 302 and 322 may be subject to two distinct feedback factors.

Accordingly, amplifier circuit 340 of FIG. 16, substituting amplifiers 302 and 322 in FIG. 13, may be configurable for two distinct gain-bandwidth products. In another embodiment, wherein amplifier 340 may be configured in a unity-gain configuration when control signals S2, S5 are both low, amplifier 340 may be modified and configurable for a third gain-bandwidth product suitable for a unity-gain configuration. Amplifier 340 is configurable via switches controlled by control signals SFB13, SFB24, SD13, SD24, which may be provided by logic-OR combinations of control signals SFB1, SFB2, SFB3, SFB4, SD1, SD2, SD3, SD4 as identified in FIG. 16.

Figure 17:
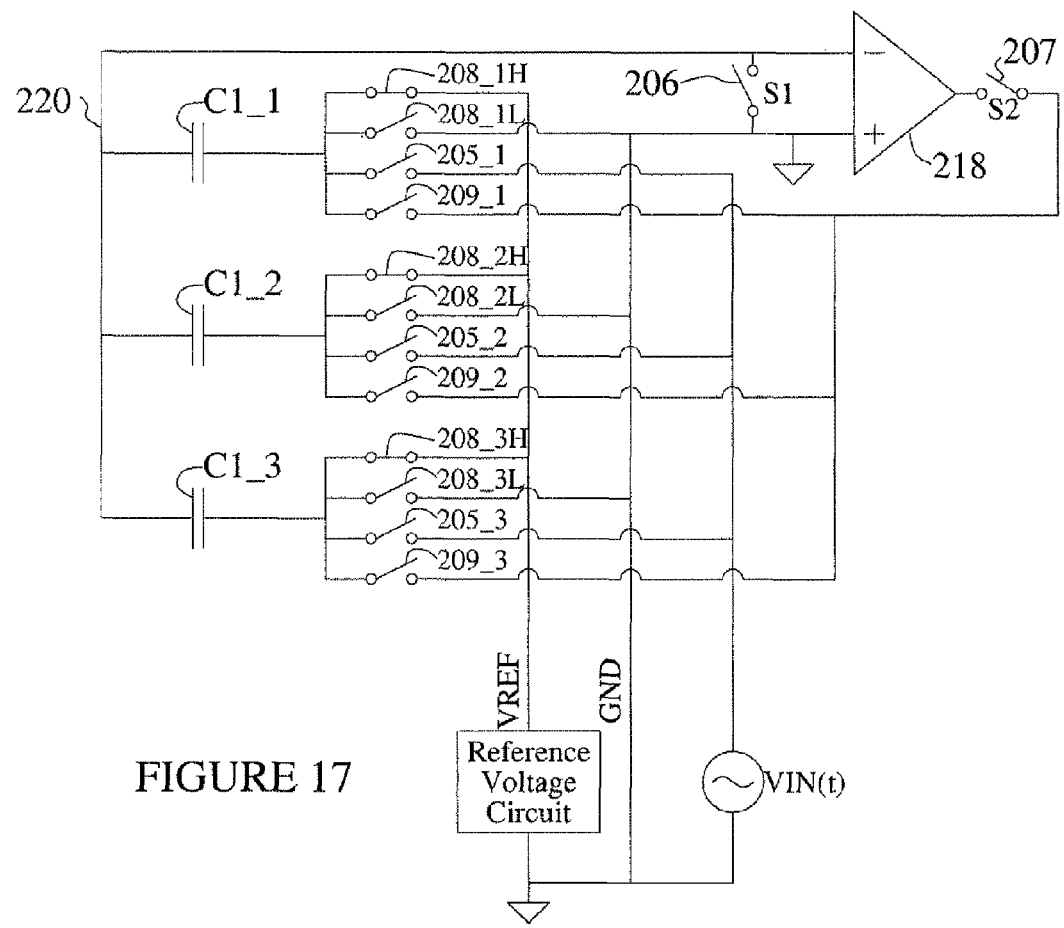
FIG. 17 shows CDAC circuitry that may be comprised in the ADC of FIG. 4.

Several embodiments have been described wherein a multi-bit DAC is coupled to a terminal of a capacitive structure that is configurable via switches. For example, in FIG. 4, capacitor C1 215 is part of a capacitive structure having a terminal that is configurable and in certain configurations applied a reference voltage potential by DAC1 202 selected according to digital code d1. Such a circuit has many equivalent implementations, including an implementation wherein capacitor C1 215, DAC1 202 and switches 208, 209, and 205 are implemented as a CDAC circuit as shown in FIG. 17. CDAC circuits are well known to those skilled in the art and do not need to be described in detail. In FIG. 17, capacitor C1 from FIG. 4 is substituted by a plurality of CDAC capacitors C1_1, C1_2, C1_3 having a common node connected to amplifier input terminal 220. Switch 205 in FIG. 4 is substituted in FIG. 17 by switches 205_1, 205_2, and 205_3, which are controlled by the same control signal S0 as switch 205 in FIG. 4. Likewise, switch 209 in FIG. 4 is substituted in FIG. 17 by switches 209_1, 209_2, and 209_3, which are controlled by the same control signal SFB1 as switch 209 in FIG. 4. Accordingly, when these switches are closed, CDAC capacitors C1_1, C1_2, and C1_3 are coupled in a parallel configuration, and configured in the same way as C1 is configured in FIG. 4. When switch 208 is closed in FIG. 4, DAC1 202 applies a reference voltage potential to C1 215 selected according to digital code d1, and a corresponding amount of charge flows to terminal 220 via capacitor C1 215. An equivalent operation may be achieved by CDAC circuit in FIG. 17, wherein (when control signal SD1 is asserted) digital code d1 controls which one of two reference voltage potentials (GND or VREF) is applied to each CDAC capacitor C1_1, C1_2, and C1_3. For example, reference voltage potential VREF may be applied to capacitor C1_1 by configuring switch 208_1H closed and switch 208_1L open. Likewise, reference voltage potential GND may be applied to capacitors C1_2 and C1_3 by configuring switches 208_2H and 208_3H open and switches 208_2L and 208_3L closed. The circuitry of FIGS. 4 and 17 may be deemed to be equivalent when the nominal amount of charge that flows to terminal 220 for each numerical value of d1 is the same. For example, for C1=4 pF and for a set {0, 1/4, 2/4, 3/4, 4/4} of possible numerical values for d1, equivalence may be achieved by choosing C1_1=1 pF, C1_2=1 pF, and C1_3=2 pF and controlling switches 208_1H, 208_2H, and 208_3H with patterns '000' for d1=0, '100' for d1=1/4, '110' for d1=2/4, '101' for d1=3/4 and '111' for d1=4/4, respectively. Although FIG. 17 does not show an implementation of all circuitry of ADC system 200 in FIG. 4, it will be understood that capacitors C2, C3 and DACs 203 and 204 may also be implemented as CDACs.

Figure 18:
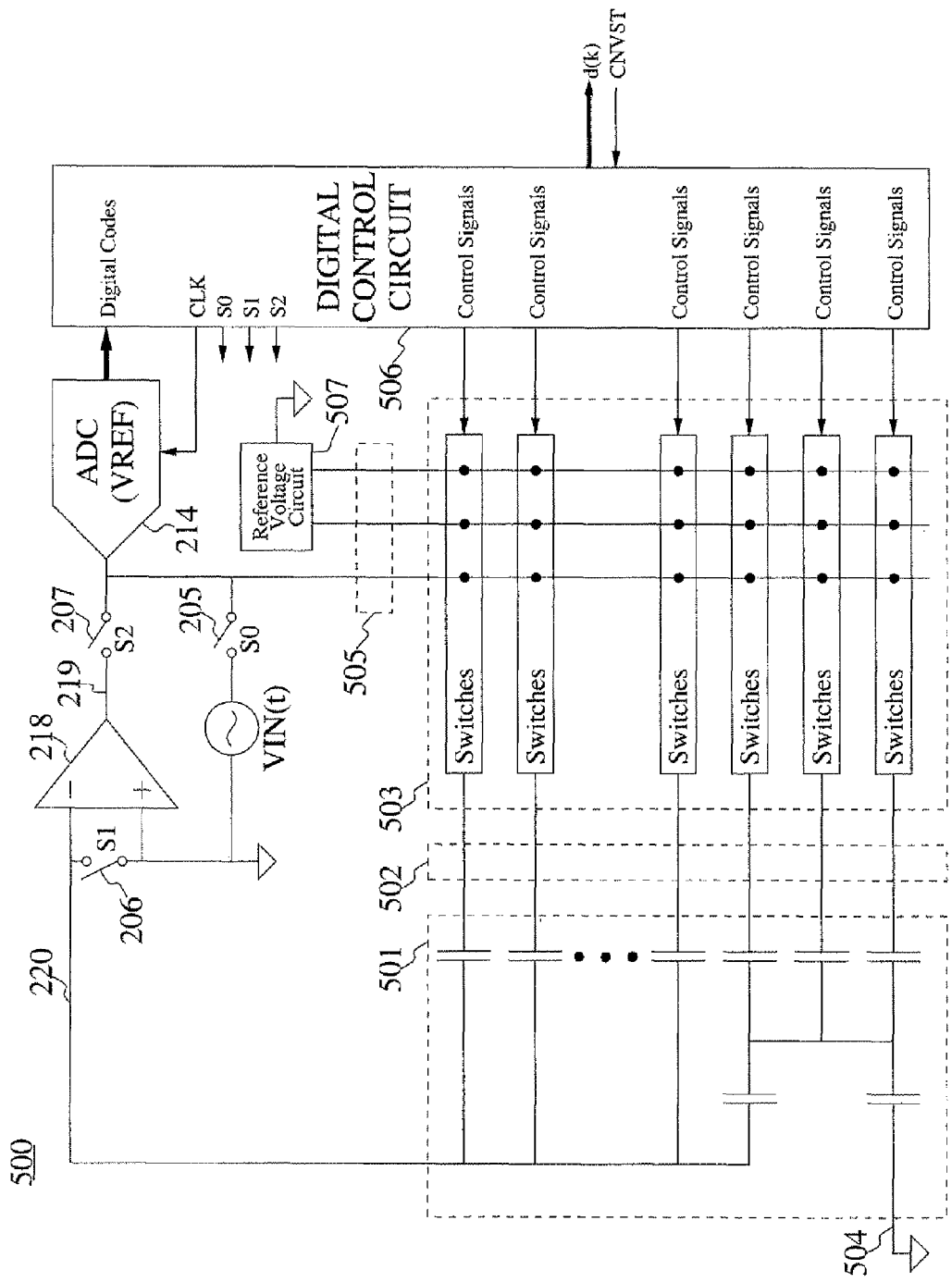
FIG. 18 shows an eighth embodiment of the present teaching.

FIG. 18 shows an implementation of an eighth embodiment of the present teaching, ADC system 500. Amplifier circuit 218, switches 205, 206, and 207, and (evaluation circuit) flash ADC 214 may be the same as these elements in ADC system 200 of FIG. 4. ADC system 500 further comprises a capacitive structure 501 having a node coupled to amplifier input terminal 220 and a plurality of capacitor terminals 502 coupled to a plurality of terminals of a switch circuit 503. Capacitive structure 501 may incorporate a charge-divider circuit that may have a capacitor terminal 504 coupled to a fixed potential (or to another capacitive structure in a fully differential implementation, not shown). Switch circuit 503 may be configured to selectively couple each terminal in the plurality of capacitor terminals 502 to a selected terminal in a plurality of switch terminals 505. Switch circuit 503 may be controlled via a plurality of control signals provided by a digital control circuit 506 that sequentially configures ADC system 500 in a plurality of configurations.

A first terminal in the plurality of switch terminals 505 may be coupled to amplifier output terminal 219 (in FIG. 18 via switch 207), such that digital control circuit 506 may configure switch circuit 503 to couple capacitive structure 501 as a feedback network for amplifier 218 in a plurality of configurations. A reference voltage circuit 507 provides a plurality of reference voltage potentials to a subset of the plurality of switch terminals 505. For example, reference voltage circuit 507 may provide a first reference voltage potential GND and a second reference voltage potential VREF that may be applied selectively to each capacitor terminal 502 via switch circuit 503. Reference voltage circuit 507 may also provide reference voltage potentials to flash ADC 214, for example to drive a voltage divider circuit coupled to a plurality of comparator circuits (not shown in FIG. 18, but an implementation of flash ADC 214 is well known to those skilled in the art).

In a tracking configuration of ADC system 500, digital control circuit 506 may configure switch circuit 503 in a tracking configuration and close switches 205, 206 to charge one or more capacitors in capacitive structure 501 to an input voltage VIN(t). An amount of charge in proportion to a sampled value VIN(k) of VIN(t) may be substantially isolated on a node of the capacitive structure coupled to amplifier input terminal 220 when digital control circuit 506 toggles control signal S1 to open switch 206. The digital control circuit 506 may apply a first configuration wherein some or all of capacitor terminals 502 are coupled to amplifier output terminal 219. Evaluation circuit 214 may provide a first digital code to represent a first voltage at amplifier output terminal 219 in the first configuration. The digital control circuit 506 may reconfigure ADC system 500 to a second configuration by controlling switch circuit 503 to disconnect one or more of capacitor terminals 502 from amplifier output terminal 219 and couple a disconnected capacitor terminal to a reference voltage potential selected according to the first digital code. The digital control circuit 506 may further reconfigure ADC system 500 to one or more subsequent configurations by controlling switch circuit 503 to disconnect additional capacitor terminals 502 from amplifier output terminal 219 and couple disconnected capacitor terminals to reference voltage potentials selected according to digital codes provided by evaluation circuit 214.

Accordingly, exemplary embodiments of the present teaching may comprises a capacitive structure 501 comprising a plurality of scaled capacitors and optional charge-divider circuitry. An amount of charge representing an analog signal value may be substantially isolated on a node 220 of the capacitive structure, and an amplifier output terminal 219 may provide an amplified voltage by amplifying a voltage potential on that node 220. A reference voltage circuit 507 may be configured to provide a plurality of reference voltage potentials to a plurality of switch terminals 505, one of which may be coupled to amplifier output terminal 219. A switch circuit 503 may selectively couple a plurality of capacitor terminals 502 to the plurality of switch terminals 505 to selectively configure the capacitive structure 501 as a feedback network in a plurality of configurations coupling amplifier output terminal 219 to amplifier input terminal 220. An evaluation circuit 214 may provide a sequence of digital codes to represent a sequence of voltages at amplifier output terminal 219 for a sequence of configurations. Switch circuit 503 may be controlled by control signals to switch one or more capacitor terminals from amplifier output terminal 219 to reference voltage potentials selected according to digital codes. A feedback factor may become weaker from one configuration to the next, and a frequency response of an amplifier circuit may be configurable to select a settling speed. The sequence of voltages may comprise amplified residue voltages of a sampled input voltage with respect to the sequence of digital codes and a reference voltage range.

A resolution of a digital code provided by evaluation circuit 214 and a number of reference voltage potentials provided by reference voltage circuit 507 may determine a number of capacitor terminals 502 that may be disconnected from amplifier output terminal 219 and applied a reference voltage potential in a step of a conversion process when the digital control circuit 506 reconfigures an ADC system 500.

An A/D conversion process implemented by ADC system 500 may involve coupling a capacitor terminal 502 to amplifier output terminal 219 in a later step of the A/D conversion process subsequent to a prior step of the A/D conversion process wherein the same capacitor terminal may have been disconnected from the amplifier output terminal 219.

In another embodiment, switches 205 and 207 may be incorporated in switch circuit 503, and evaluation circuit 214 may be connected to amplifier output terminal 219. Switch circuit 503 may support all or a subset of the selectable connections of a full switch matrix.

Numerous variations of the present teaching are envisioned, and the embodiments described herein are merely illustrations of exemplary embodiments. The appropriate choice of circuitry may depend on the specific application and other factors such as the available types of semiconductors, capacitors, resistors, reliability voltage limits, silicon area, cost, and additional factors and considerations typically involved in the design of an integrated circuit. For example, a digital control circuit may be implemented as a state machine in a CMOS technology, or using any other known circuit technique, method and process technology suitable for the implementation of such circuits. Each embodiment may incorporate switches implemented as CMOS transmission-gate switches, bootstrapped switches, single-device switches, and/or any other suitable switching devices. An ADC system implemented according to this present teaching may incorporate a plurality of types of semiconductor devices (including all flavors of MOS, BJT, IGBT, IGFET, JFET, FINFET, organic transistors, nano-carbon-tube devices etc.), some of which may be selected to withstand a high-voltage input signal VIN(t), and some of which may be selected for fast settling of low-voltage circuit nodes. Accordingly, an ADC system may be implemented using a technology that provides asymmetrical devices (BCD etc.) in addition to symmetrical MOS devices, and the technology may incorporate oxides and other physical structures having a plurality of dimensions and electrical properties. Those who are skilled in the art will recognize that ADC systems 200, 300, and 500 (depicted in FIGS. 4, 13, 18) and any other single-ended embodiment of this present teaching may be modified to a similar fully-differential exemplary embodiment of the present teaching. Accordingly, an ADC system according to this present teaching may interface differential signals with an arbitrary common-mode voltage level. Other embodiments may interface single-ended signals (unipolar or bipolar) defined with respect to a reference voltage potential that may or may not be sampled substantially at the same time as the input signal voltage is sampled (pseudo-differential operation). A full-scale range for an ADC system according to this present teaching may be substantially the same as a reference voltage range. Alternatively, an ADC system according to the present teaching may incorporate analog attenuation and/or digital scaling techniques to provide one or more selectable full-scale ranges that are either wider or narrower than a reference voltage range. Input signals may be provided by active and/or passive circuits, which may be designed to optimize a range of performance parameters, such as settling time, noise bandwidth, distortion, power consumption, etc. An ADC system according to this invention may consume very little power (including substantially zero power) in a tracking configuration where a capacitor is being charged according to an input signal while active circuitry is in a power-down (or other reduced-power) configuration, and a common-mode shift, charge-pumping, and other techniques may be applied during one or more steps of an A/D conversion process to make circuitry operate with respect to a desired operation point (e.g. to preserve an isolated amount of charge by not substantially forward-biasing isolating PN junctions, or to provide a desired frequency response, gain function, etc.). A signal path in a configurable amplifier circuit may comprise a different number of stages for different configurations. An evaluation circuit is exemplified by a flash ADC, but other types of evaluation circuits may be used with this present teaching. For example, a ring oscillator having a power supply terminal coupled to amplifier terminal 219 and providing a digital code expressing a phase shift during a period of time is another type of evaluation circuit that may be used with the present teaching. Many other types of evaluation circuits, including sub-ranging and other multi-step ADCs, may be used with the present teaching. Redundancy may preferably be incorporated in any embodiment of the present teaching, and a degree of redundancy may be selected to meet specific objectives, such as conversion rate, latency, resolution, environmental parameters, circuit complexity, etc.

Mismatch-shaping algorithms, application of dither (additive and/or transparent), calibration techniques, digital correction/compensation techniques (static and/or adaptive, operating in the background, foreground, in-loop and/or out-of-loop), oversampling, decimation filtering (including, but not limited to, simple averaging) and any other known method to overcome imperfections of a data converter circuit and/or to improve its performance may be used in combination with this present teaching. This present teaching may be incorporated as a subsystem in a larger ADC system (e.g., it may be combined with other types of ADCs, including traditional pipelines, SAR ADCs, delta-sigma ADCs, etc.). The present teaching may also be embodied in integrated-circuit systems of a higher degree of functional complexity, such as industrial control systems, medical applications (e.g., x-ray and MRI machines), consumer application (e.g., games and television), etc. An ADC system according to the present teaching may interface several distinct analog signals, e.g., via a multiplexing frontend circuit and an optional array of sample-and-hold circuits. An ADC implemented according to the present teaching may be implemented on a single semiconductor substrate, or as multiple semiconductors in a package, or as several devices assembled on a printed circuit board (or otherwise). An ADC implemented according to the present teaching may incorporate timing circuits causing transitions between various configurations, or it may receive timing signals provided by some external source. Digital codes and numerical representations of analog signal values may be encoded in various formats, and may be communicated to external systems in a serial format, a parallel format, or some other format deemed suitable or advantageous for the applications. Such digital codes may be communicated (and power may be provided) via an interface providing galvanic isolation to limit interference, enhance safety, or derive some other benefit.

Accordingly, while particular embodiments of the present teaching have been shown and described, it will be obvious to those skilled in the art that changes and modifications may be made without departing from this present teaching in its broader aspects and, therefore, the appended claims are to encompass within their scope all such changes and modifications that are within the true spirit and scope of this present teaching.

What is claimed is:

1. An analog-to-digital converter system, comprising:
    a digital control circuit configured to sequentially configure the analog-to-digital converter system in a first configuration and a second configuration to derive a digital representation of an analog signal value;
    an amplifier circuit having an amplifier input terminal and an amplifier output terminal;
    a capacitor having a first capacitor terminal coupled to the amplifier input terminal in the first and second configurations of the analog-to-digital converter system and a second capacitor terminal coupled to the amplifier output terminal in the first configuration of the analog-to-digital converter system; and
    an evaluation circuit configured to provide a first digital code to represent a first voltage level at the amplifier output terminal in the first configuration of the analog-to-digital converter system;
    wherein the second capacitor terminal in the second configuration of the analog-to-digital converter system is coupled to a reference voltage potential selected according to the first digital code.

2. The analog-to-digital converter system of claim 1, further comprising a sampling circuit comprising a switch configured to couple an analog input signal to charge the capacitor in a tracking configuration of the analog-to-digital converter system.

3. The analog-to-digital converter system of claim 1, further comprising:
    a second capacitor coupled between the amplifier input terminal and the amplifier output terminal in the second configuration of the analog-to-digital converter system, wherein the evaluation circuit is further configured to provide a second digital code to represent a second voltage level at the amplifier output terminal in the second configuration of the analog-to-digital converter system.

4. The analog-to-digital converter system of claim 3, wherein the second capacitor in a third configuration of the analog-to-digital converter system is coupled between the amplifier input terminal and a reference voltage potential selected according to the second digital code.

5. The analog-to-digital converter system of claim 4, wherein an amount of charge representing the analog signal value is substantially isolated on a circuit node coupled to the amplifier input terminal during a period of time when the analog-to-digital converter system is configured in the first, second, and third configurations.

6. The analog-to-digital converter system of claim 4, further comprising:
    an analog-to-digital converter circuit configured to provide a third digital code to represent a third voltage level at the amplifier output terminal in the third configuration of the analog-to-digital converter system; and
    a digital circuit configured to combine the first, second, and third digital codes.

7. The analog-to-digital converter system of claim 1, wherein the amplifier circuit comprises a configurable first amplifier stage providing an output current, the first amplifier stage comprising:
    a first transconductance circuit configured to provide the output current in the first configuration of the analog-to-digital converter system; and
    a second transconductance circuit configured to provide at least a portion of the output current in the second configuration of the analog-to-digital converter system.

8. The analog-to-digital converter system of claim 7, wherein the second transconductance circuit is configured to have a predefined input voltage in the first configuration of the analog-to-digital converter system.

9. The analog-to-digital converter system of claim 7, wherein the second transconductance circuit is configured in an auto-zeroing configuration in the first configuration of the analog-to-digital converter system.

10. An analog-to-digital converter system for providing a digital representation of a sampled value of an analog input signal, comprising:
    a switch circuit having a plurality of switches and a first plurality of switch terminals and a second plurality of switch terminals, where the switch circuit is configured to selectively couple the first plurality of switch terminals to the second plurality of switch terminals;
    an amplifier circuit having an amplifier input terminal and an amplifier output terminal, where the amplifier output terminal is coupled to a first switch terminal in the first plurality of switch terminals;
    a reference voltage circuit configured to provide a plurality of reference voltage potentials on a subset of switch terminals in the first plurality of switch terminals;
    a capacitive structure including a plurality of scaled capacitors, where the capacitive structure is coupled to the amplifier input terminal and to the second plurality of switch terminals;
    an evaluation circuit configured to provide a second digital code to represent a voltage at the amplifier output terminal when the switch circuit is configured in a first configuration according to a first digital code provided by the evaluation circuit; and
    a combination circuit configured to combine the first digital code and the second digital code to provide the digital representation.

11. The analog-to-digital converter system of claim 10, wherein an amount of charge representing the sampled value of the analog input signal is substantially isolated from a first point in time when the evaluation circuit is clocked to provide the first digital code to a second point in time when the evaluation circuit is clocked provide the second digital code.

12. The analog-to-digital converter system of claim 10, wherein the switch circuit is configured to couple each terminal in the second plurality of switch terminals to one terminal in the first plurality of switch terminals.

13. The analog-to-digital converter system of claim 10, wherein the evaluation circuit provides the first digital code to represent the sampled value of the analog input signal based on a substantially predefined relationship.

14. The analog-to-digital converter system of claim 10, wherein the switch circuit is reconfigured from the first configuration to a second configuration based on the first and second digital codes.

15. The analog-to-digital converter system of claim 14, wherein the evaluation circuit is configured to provide a third digital code to represent a voltage at the amplifier output terminal when the switch circuit in configured in the second configuration.

16. The analog-to-digital converter system of claim 14, wherein a coupling from the amplifier output terminal to the amplifier input terminal is weaker when the switch circuit is configured in the second configuration compared to when the switch circuit is configured in the first configuration.

17. The analog-to-digital converter system of claim 14, wherein the amplifier circuit is configured to have a higher gain-bandwidth product when the switch circuit is configured in the second configuration compared to when the switch circuit is configured in the first configuration.

18. The analog-to-digital converter system of claim 14, further comprising an analog-to-digital converter circuit configured to sample a voltage having a predefined relationship with a voltage at the amplifier output terminal.

19. The analog-to-digital converter system of claim 10, wherein the capacitive structure comprises a charge-divider circuit.

20. The analog-to-digital converter system of claim 10, further comprising a sampling switch configured to couple the analog input signal to charge a capacitor in the capacitive structure.

21. The analog-to-digital converter system of claim 10, wherein the evaluation circuit is a one-step analog-to-digital converter configured to have at least two transition points in a reference voltage range.

22. A method for providing a digital representation of an analog voltage, comprising the steps of:
charging at least one capacitor of a plurality of capacitors in proportion to the analog voltage;
providing an amplifier circuit having an amplifier input terminal and an amplifier output terminal;
applying a first configuration wherein the plurality of capacitors are coupled to the amplifier input terminal and the amplifier output terminal;
generating a first digital code to represent a first voltage level at the amplifier output terminal in the first configuration;
applying a second configuration by switching a terminal of a capacitor of the plurality of capacitors from the amplifier output terminal to a reference voltage potential selected according to the first digital code;
generating a second digital code to represent a second voltage level at the amplifier output terminal in the second configuration; and
combining the first and second digital codes to generate the digital representation of the analog voltage.

23. The method of claim 22, further comprising the step of isolating an amount of charge on a circuit node coupled to the amplifier input terminal during the first and second configurations.

24. The method of claim 22, further comprising the step of providing redundancy.

25. The method of claim 22, further comprising the step of auto-zeroing the amplifier circuit.

26. The method of claim 22, further comprising the step of sampling the second voltage level.

27. A method for providing a digital representation of an analog voltage comprising the steps of:
providing a capacitive structure having a first node, a first terminal, and a second terminal;
isolating an amount of charge on the first node of the capacitive structure in proportion to the analog voltage;
amplifying a voltage potential on the first node of the capacitive structure to provide an amplified voltage on an amplifier output terminal;
configuring the capacitive structure in a first configuration wherein the first terminal of the capacitive structure is coupled to the amplifier output terminal;
generating a first digital code to represent a first voltage at the amplifier output terminal when the capacitive structure is configured in the first configuration;
reconfiguring the capacitive structure in a second configuration wherein the first terminal of the capacitive structure is coupled to a reference voltage potential selected according to the first digital code and the second terminal of the capacitive structure is coupled to the amplifier output terminal;
generating a second digital code to represent a second voltage at the amplifier output terminal when the capacitive structure is configured in the second configuration; and
combining the first and second digital codes to generate the digital representation of the analog voltage.

28. The method of claim 27, further comprising the step of reconfiguring the capacitive structure in a third configuration, wherein the first terminal of the capacitive structure is coupled to a reference voltage potential selected according to the first digital code and the second terminal of the capacitive structure is coupled to a reference voltage potential selected according to the second digital code.

29. The method of claim 28, further comprising the steps of:
generating a third digital code to represent a third voltage at the amplifier output terminal when the capacitive structure is configured in the third configuration; and
combining the first, second, and third digital codes to generate the digital representation of the analog voltage.

30. An analog-to-digital converter comprising:
a digital control circuit configured to sequentially configure the analog-to-digital converter in a first configuration and a second configuration to provide a digital representation of an analog value;
a configurable amplifier circuit having an amplifier input terminal and an amplifier output terminal; and
a configurable feedback network configured to couple the amplifier output terminal to the amplifier input terminal, wherein
the configurable amplifier circuit is configured to have a first frequency response in the first configuration and a second frequency response in the second configuration to optimize a settling behavior in the first and second configurations of the analog-to-digital converter.

31. The analog-to-digital converter of claim 30, wherein the configurable amplifier circuit comprises a configurable transconductance stage providing a current,
a feedback factor of the configurable feedback network is weaker in the second configuration than it is in the first configuration of the analog-to-digital converter, and
an effective transconductance of the configurable transconductance stage is greater in the second configuration than it is in the first configuration of the analog-to-digital converter.

32. The analog-to-digital converter of claim 31, wherein the current provided by the configurable transconductance stage is coupled to a compensation capacitor, and
a gain-bandwidth product of the configurable amplifier circuit is substantially proportional to the effective transconductance of the configurable transconductance stage and substantially inversely proportional to a capacitance of the compensation capacitor.

33. The analog-to-digital converter of claim 30, wherein the configurable amplifier circuit comprises a transconductance stage providing a current coupled to a configurable compensation capacitor,
a feedback factor of the configurable feedback network is weaker in the second configuration than it is in the first configuration of the analog-to-digital converter, and
a capacitance of the configurable compensation capacitor is smaller in the second configuration than it is in the first configuration of the analog-to-digital converter.

34. The analog-to-digital converter of claim 30, wherein the configurable amplifier circuit is configurable in an auto-zeroing configuration.

* * * * *